(12) United States Patent
Noguchi

(10) Patent No.: US 11,520,146 B2
(45) Date of Patent: Dec. 6, 2022

(54) DISPLAY DEVICE AND DISPLAY METHOD OF IMAGE

(71) Applicant: SEIKO EPSON CORPORATION, Tokyo (JP)

(72) Inventor: Toshiyuki Noguchi, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 158 days.

(21) Appl. No.: 16/872,718

(22) Filed: May 12, 2020

(65) Prior Publication Data

US 2020/0363641 A1    Nov. 19, 2020

(30) Foreign Application Priority Data

May 13, 2019  (JP) .............................. JP2019-090370

(51) Int. Cl.
*G02B 27/01* (2006.01)
*H04N 9/31* (2006.01)
*H01L 27/32* (2006.01)

(52) U.S. Cl.
CPC ...... *G02B 27/0172* (2013.01); *H01L 27/3232* (2013.01); *H04N 9/3158* (2013.01); *H04N 9/3164* (2013.01); *G02B 2027/0105* (2013.01); *G02B 2027/0116* (2013.01); *G02B 2027/0174* (2013.01); *G02B 2027/0178* (2013.01)

(58) Field of Classification Search
CPC .......... G02B 27/017; G02B 2027/0105; G02B 2027/0116; G02B 2027/0174; G02B 2027/0178; G02B 27/0172; H01L 27/3232; H04N 9/3158; H04N 9/3164
See application file for complete search history.

(56) References Cited

U.S. PATENT DOCUMENTS

2010/0039796 A1*  2/2010  Mukawa ............ G02B 27/0081
                                                362/97.1

FOREIGN PATENT DOCUMENTS

JP      2005-241825 A      9/2005
JP      2010-044172 A      2/2010

* cited by examiner

*Primary Examiner* — Alexander Eisen
*Assistant Examiner* — Cory A Almeida
(74) *Attorney, Agent, or Firm* — Oliff PLC

(57) ABSTRACT

An image in a predetermined hue is displayed at a display surface, and is emitted as image light. The image light is guided to a display position by an optical system, and is deflected by a diffraction optical element. The emitted image light includes light emitted from a first position of the display surface and light emitted from a second position of the display surface. A deflection angle at which the light emitted from the first position is diffracted by the diffraction optical element is larger than a deflection angle at which the light emitted from the second position is diffracted by the diffraction optical element. Of the image light in a wavelength range expressing the hue, a wavelength peak of the light emitted from the first position is present on a long wavelength side with respect to a wavelength peak of the light emitted from the second position.

16 Claims, 16 Drawing Sheets

DISPLAY DEVICE AND DISPLAY METHOD OF IMAGE

The present application is based on, and claims priority from JP Application Serial Number 2019-090370, filed May 13, 2019, the disclosure of which is hereby incorporated by reference herein in its entirety.

BACKGROUND

1. Technical Field

The present disclosure relates to a display device including a diffraction optical element and a display method thereof.

2. Related Art

In recent years, various types of an eyeglass display device have been proposed. Reduction in device size and reduction in thickness have been demanded for such display device regardless of whether the display device itself is a see-through type having high transmittance and enabling an outside scene to be visually recognized. The display device includes an image formation unit that forms an image, a display unit that is arranged in front of an eye and displays the image, and a light-guiding unit that connects the image formation unit and the display unit. In general, in the light-guiding unit, incident light is guided by repeating total reflection inside the light-guiding unit. Thus, when reduction in size and reduction in thickness are to be achieved in the display device, a light advance direction is required to be changed largely in order to guide light from the image formation unit to the light-guiding unit. The same holds true in a case where light from the light-guiding unit is guided to the display unit. For this purpose, a diffraction optical element (also referred to as a holographic optical element) is used.

When a diffraction optical element is used, an advance direction of light is largely changed. Thus, it is difficult to obtain even light intensity distribution of a displayed optical image on a display surface of the displayed image. Thus, various attempts for correcting light intensity distribution on a screen have hitherto been made (for example, see JP-A-2010-44172).

A diffraction optical element deflects light in a direction for satisfying Bragg's condition, and hence a main wavelength of diffracted light differs depending on an angle of incident light. However, the technique disclosed in JP-A-2010-44172 cannot make improvement for unevenness of light intensity distribution on a display surface, which is caused by such reason. In JP-A-2010-44172, brightness of the display screen is made uniform simply by adjusting illuminance of backlight, and no measure is taken for deviation of a diffraction wavelength in a diffraction optical element.

SUMMARY

The present disclosure contains a display device in the following aspect. The display device includes an image information unit configured to display an image in a first hue at a display surface, thus emitting the image as image light, an optical system configured to guide the image light to a display position, and a diffraction optical element configured to deflect the image light in the optical system. Here, a first angle at which the diffraction optical element deflects light emitted from a first position of the display surface may be larger than a second angle at which the diffraction optical element deflects light emitted from a second position of the display surface. The image formation unit may emit image light including light emitted from the first position and light emitted from the second position, and a wavelength peak of light emitted from the first position may be present on a long wavelength side with respect to a wavelength peak of light emitted from the second position.

DESCRIPTION OF EXEMPLARY EMBODIMENTS

A. First Exemplary Embodiment

Figure 1:
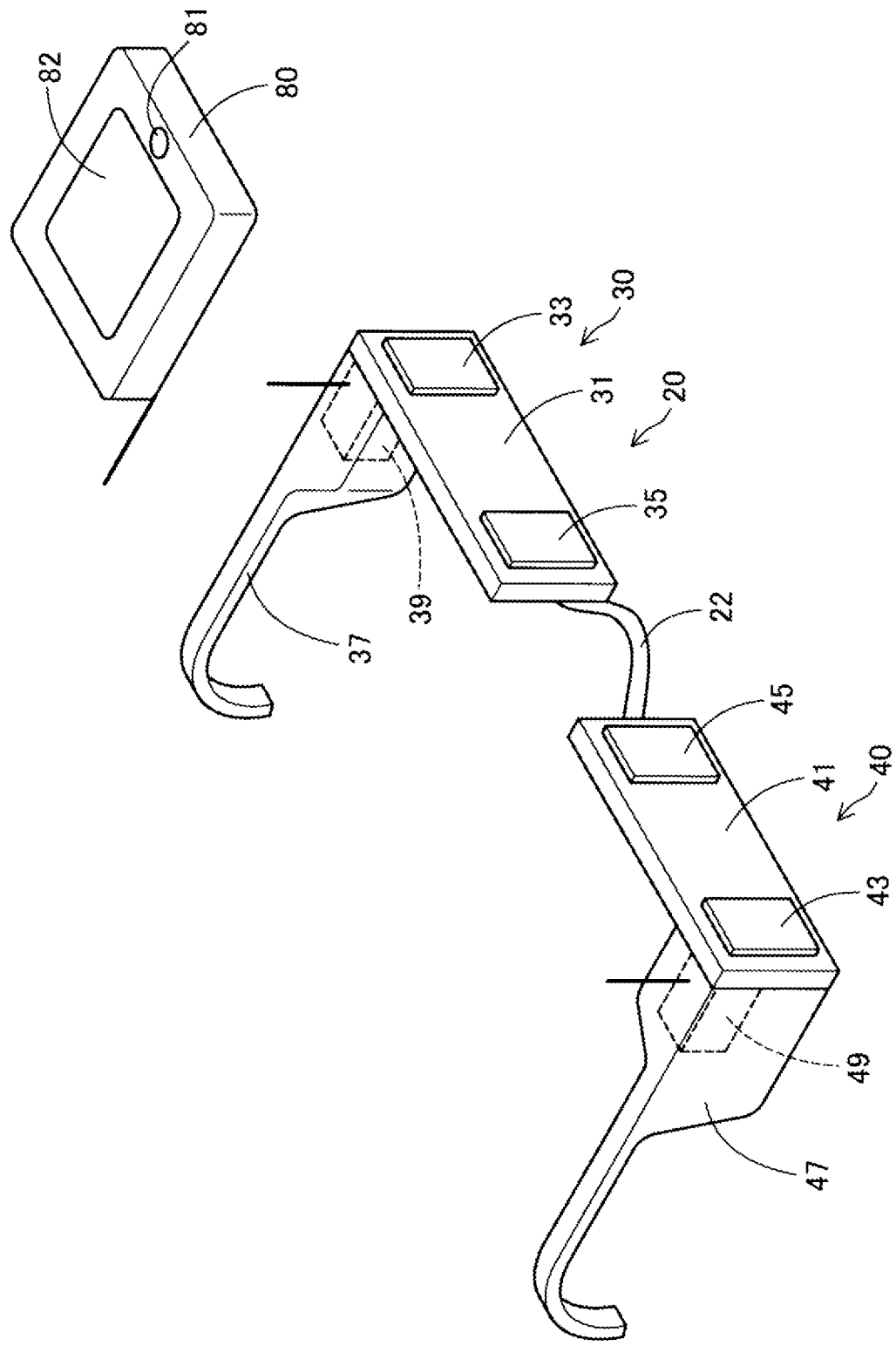
FIG. 1 is a perspective view illustrating an external appearance of a display device according to a first exemplary embodiment.

FIG. 1 is a perspective view of a display device 20 according to a first exemplary embodiment. As illustrated in FIG. 1, the display device 20 is a so-called eyeglasses type, and is a so-called see-through type that enables a user to visually recognize an outside scene through the display device 20. The display device 20 includes a left-eye display unit 30 and a right-eye display unit 40 that are arranged on a left side and a right side as viewed from a user (hereinafter, referred to as an observer), a bridge 22 that connects both the display units 30 and 40 to each other, a left temple 37 mounted to an end of the left-eye display unit 30, a right temple 47 mounted to an end of the right-eye display unit 40, a left image formation unit 39 incorporated in a thick portion of the thick portion of the left temple 37, a right image formation unit 49 incorporated in a thick portion of the right temple 47, and an image transmission device 80 that wirelessly transmits image data to the left image formation unit 39 and the right image formation unit 49.

The image transmission device 80 is a terminal capable of editing and storing pictures and images, and is achieved as, for example, a smartphone, a tablet, or a dedicated device. The image transmission device 80 includes an activation button 81 for activation and a display 82 obtained by laminating a touch panel on a front surface, and transmits still images such as pictures and moving images, which are stored, to the left and right image formation units 39 and 49 by operating the touch panel. Distal ends of the left and right temples 37 and 47 are curved downward as tip cells, and are used for mounting the display device 20 on ears of a user.

Figure 2:
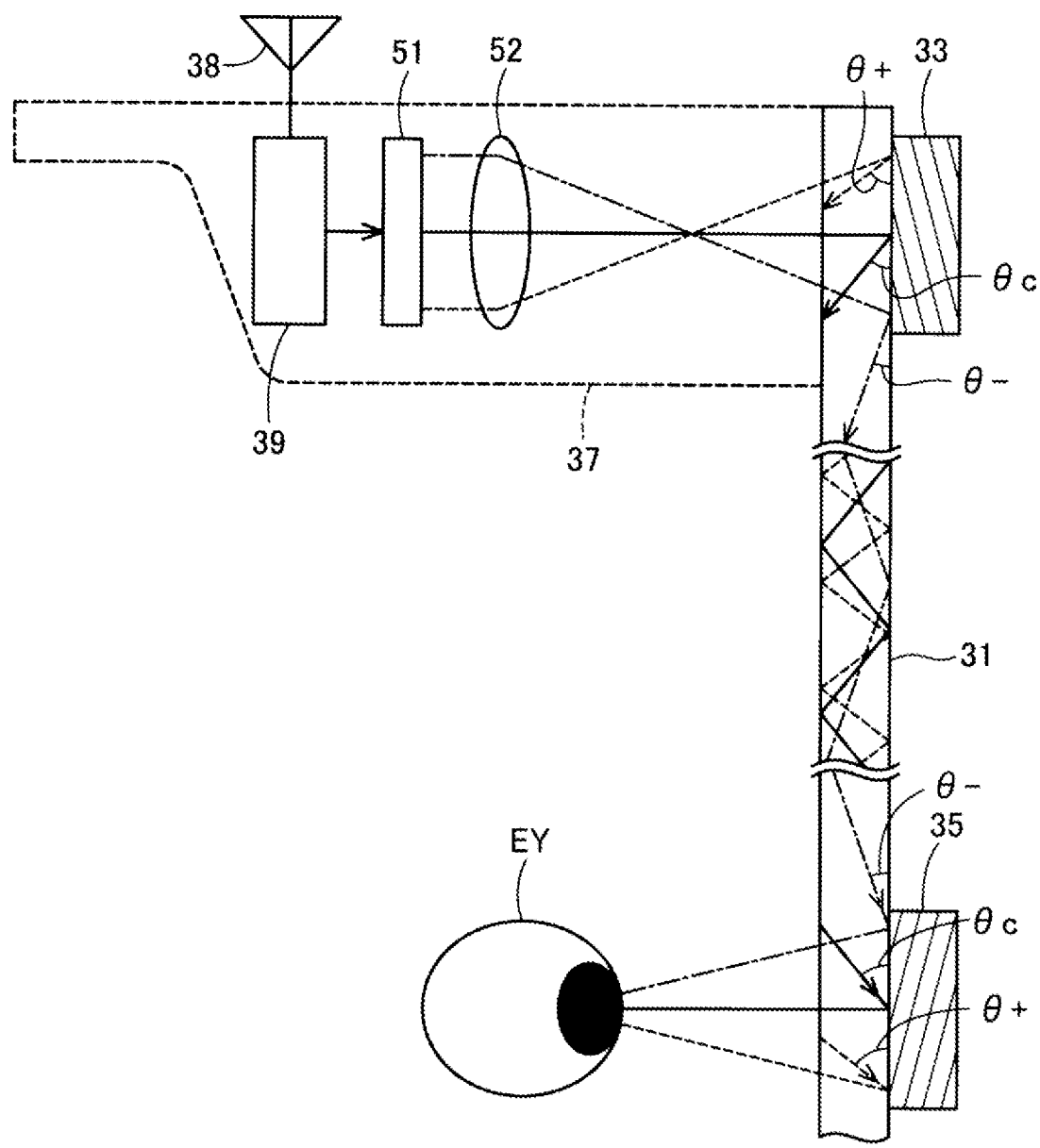
FIG. 2 is an explanatory view schematically illustrating a configuration of a left-eye display unit.

The left-eye display unit 30 and the right-eye display unit 40 have the same configuration except that the respective components are arranged in a left-right symmetrical manner. Thus, hereinafter, the left-eye display unit 30 is given as an example for describing a configuration of the display unit, and configurations and functions of the respective components are the same as those in the right-eye display unit 40. FIG. 2 is an explanatory view schematically illustrating the configuration of the left-eye display unit 30. As in the illustrated example, when receiving transmission of an image from the image transmission device 80 via an antenna 38, the image formation unit 39 incorporated in the left temple 37 forms the received image on a display 51. The display 51 is a display on which fine light emitting diodes emitting light in green are arrayed. The image formed on the EL display 51 is emitted as image light from the EL display, is paralleled by a collimate lens 52, and enters the left-eye display unit 30. The image formed on the display 51 may be a still image and a moving image. In the present exemplary embodiment, the display 51 forms an image of a first hue (here, a green image). As described above, the image may be a full color image using three primary colors (RGB), and may be a limited color image using two primary colors (for example, R and G). Description is made on a case of an image with a plurality of hues in a second exemplary embodiment. The "hue" in the present specification indicates a color having wavelength distribution within a wavelength range for expressing a hue of the color instead of a color having a single wavelength. For example, light in a green hue is formed not only by light having a single wavelength of 530 nm, but generally includes light within a wavelength range that can be sensed as "green" with a human eye. Further, the display does not emit only light having a single wavelength, but emits light within a certain wavelength range, which has a specific peak wavelength. This is applied similarly in both cases of displaying a single color and displaying a color image.

In the present exemplary embodiment, light-guiding bodies 31 and 41 forming an optical system are arranged to guide light in a direction in which both eyes of an observer are arrayed, as illustrated in FIG. 1. Description is made on names of directions in the present specification including other exemplary embodiments. When a user stands upright and wears the display device 20, a gravitational direction is referred to as a downward direction, and a direction opposite to the gravitational direction is referred to as an upward direction. A direction with respect to a head is referred to as a vertical direction. Further, a direction, which is substantially orthogonal to the vertical direction and is an arrangement direction of both eyes, is referred to as a horizontal direction. In the first exemplary embodiment, the left-eye display unit 30 and the right-eye display unit 40 are arrayed along the horizontal direction. Meanwhile, with respect to the light-guiding bodies 31 and 41, a direction in which light is guided inside the light-guiding bodies (generally, a longitudinal direction of the light-guiding bodies 31 and 41) is referred to as a light-guiding direction. On a plane on which an incident diffraction optical element 33 and an emission diffraction optical element 35 of the light-guiding bodies 31 and 41 are provided, a direction orthogonal to the light-guiding direction is referred to as a width direction. In the first exemplary embodiment, the horizontal direction matches with the light-guiding direction, and the vertical direction matches with the width direction.

The left-eye display unit 30 includes the incident diffraction optical element 33 and the emission diffraction optical element 35 in the vicinities of both ends of the light-guiding body 31 on a surface opposite to a surface that light from the display 51 enters. In the present exemplary embodiment, each of the incident diffraction optical element 33 and the emission diffraction optical element 35 is a reflective volumetric hologram having a pattern for causing light diffraction (also referred to as a reflective volumetric holographic element), and a hologram on which an interference pattern corresponding to a green color is adopted.

An angle of light entering the incident diffraction optical element 33 and the emission diffraction optical element 35 is referred to as an angle of view. An image formed on the display 51 being a display surface has two-dimensional expansion, light entering the incident diffraction optical element 33 through the collimate lens 52 and image light emitted from the emission diffraction optical element 35 in a direction to an eye EY of an observer have predetermined angles depending on a position of the surface of the display 51. Among those angles, an angle in the light-guiding direction of the light-guiding body 31 is referred to as an angle of view θ. A center angle of view of image light vertically entering the incident diffraction optical element 33 at the center position of the display 51 in the light-guiding direction and the image light or image light vertically emitted from the center of the emission diffraction optical element 35 in the light-guiding direction with respect to the eye EY is referred to as θc. An angle of image light entering a range from the center angle of view θc to an end of the incident diffraction optical element 33 in the light-guiding direction, that is an end on the emission diffraction optical element 35 side is referred to as the negative angle of view θ−. On the emission diffraction optical element 35 side, an angle of image light emitted to the eye EY of the observer from the range from the center angle of view θc to an end of on a side opposite to the emission diffraction optical element 35 in the light-guiding direction, that is, an end on the incident diffraction optical element 33 side is the negative angle of view θ−. Similarly, as seen from the center angle of view θc, a side opposite to the negative angle of view θ− is referred to as a positive angle of view θ+. In a case of the incident diffraction optical element 33, an angle of image light entering a range from the center of the incident diffraction optical element 33 to an end on a side opposite in the light-guiding direction is referred to as the positive angle of view θ+. In a case of the emission diffraction optical element 35, an angle of image light emitted from a range from the center of the emission diffraction optical element 35 to the end in the light-guiding direction is referred to as the positive angle of view θ+. Note that the angle of view θ− at the negative end and the angle of view θ+ at the positive end are simply denoted with the angle of view θ− and the angle of view θ+ in a case where a position at which image light enters or is emitted is apparent.

Figure 3:
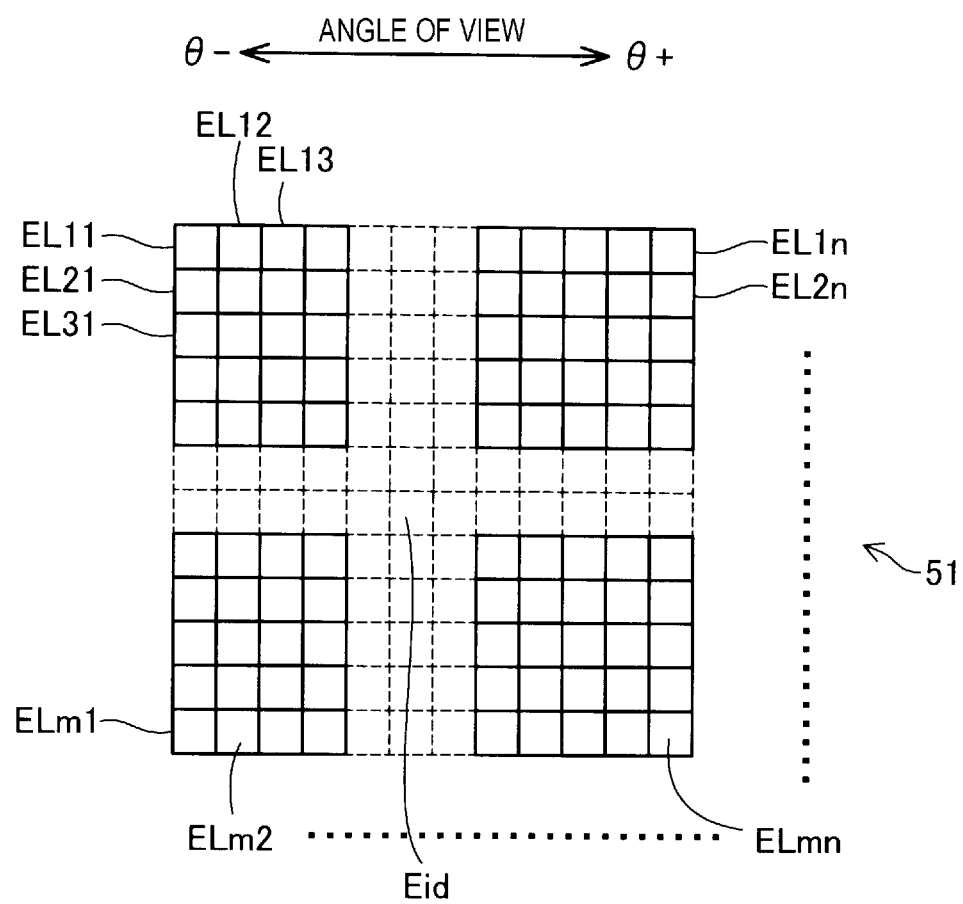
FIG. 3 is an explanatory view illustrating arrangement of light emitting diodes on a display surface of a display.

Next, description is made on a configuration of the display 51. FIG. 3 is an explanatory view illustrating a two-dimensional shape of the display 51. As in the illustrated example, the display 51 is an LED array formed of a plurality of light emitting diodes. The display 51 includes, at the display surface, a two-dimensional configuration in which a plurality of (m) light emitting diodes EL are arrayed in a vertical direction and a plurality of (n) light emitting diodes EL are arrayed in a lateral direction in the drawing. The light emitting diodes are denoted with EL11 to Elmn, respectively. Each light emitting diode is denoted with ELij using integers i and j ($1 \leq i \leq m$ and $1 \leq j \leq n$). The lateral direction of the display 51, that is, an array direction of ELi1 to ELin matches with a direction from the negative angle of view θ− to the positive angle of view θ+ illustrated in FIG. 2. Meanwhile, the vertical direction of the display 51, that is, an array direction of EL1j to ELmj matches with the width direction of the light-guiding body 31.

Figure 4:
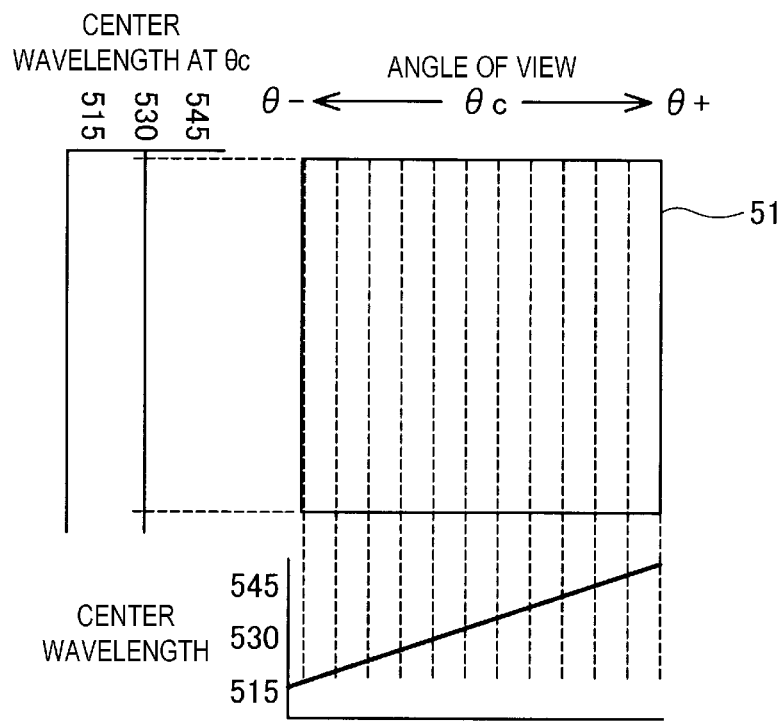
FIG. 4 is an explanatory view illustrating a relationship of an angle of view and a center wavelength on the display.

The light emitting diodes ELij forming the display 51 have different frequency ranges of emitted light and peak wavelengths (hereinafter, also referred to as center wavelengths). In general, a wavelength range of emitted light of a light emitting diode is approximately ±50 nm with respect to a center wavelength. For example, a green light emitting diode adopted to the display 51 in the first exemplary embodiment has a center wavelength of 530 nm and a light emission range of from approximately 480 nm to 580 nm. As illustrated in FIG. 4, for the display 51, a center wavelength of light emission is selected so as to be gradually increased from 515 nm to 545 nm in a range from an end position with the largest negative angle of view θ− to an end position with the largest positive angle of view θ+, that is, from the light emitting diode ELi1 to the light emitting diode ELin. Note that, on the display 51, in a direction orthogonal to the direction from the angle of view θ− to the angle of view θ+, that is, the width direction of the light-guiding body 31, the center frequency of the light emitting diodes EL1j to ELmj is constant at each position of each angle of view. In FIG. 4, on the left side of the display 51, the center wavelength at the center angle of view θc is indicated. At the position at the center angle of view θc, the center wavelength of light emitted from all the light emitting diodes EL1j to ELmj is 530 nm.

By adopting such configuration, even when the image light of the image formed on the surface of the display 51 enters the eye EY of the observer via the incident diffraction optical element 33, the light-guiding body 31, and the emission diffraction optical element 35, unevenness of the two-dimensional image observed by an observer is suppressed. The reasons for this are described below.

B. Suppression of Image Unevenness

As described above, in FIG. 2, a difference in position at which the image light from the display 51 enters the incident diffraction optical element 33 and a difference in position of the image light emitted from the emission diffraction optical element 35, particularly, a difference in position in the light-guiding direction is indicated as a difference in angle of view θ. The diffraction optical element adopted as each of the incident diffraction optical element 33 and the emission diffraction optical element 35 is a reflective volumetric hologram, and has interference patterns as patterns for diffraction. The interference patterns have a structure obtained by alternately laminating planar layers having different refractive indexes in a predetermined direction (pitch direction). When an interval between the interference patterns in the predetermined direction is indicated with a pitch d, and a wavelength of incident light is indicated with λ, the incident light is diffracted in an angle direction α satisfying Expression (1) given below.

$$d \cdot \sin \alpha = m \cdot \lambda \quad (1)$$

Note that, in Expression (1), m is a degree. In general, diffraction light in a direction satisfying m=1 is dominant. The patterns being the interference patterns and the like formed on the incident diffraction optical element 33 and the emission diffraction optical element 35 are intended to deflect light. Thus, the pitch direction of the patterns is inclined in the light-guiding direction with respect to the advance direction of the incident light, and is inclined with respect to a surface that the incident light enters. Therefore, on the surface of the reflective volumetric hologram that the incident light enters, the patterns being the interference patterns and the like extending in the direction intersecting the light-guiding direction are arranged in the light-guiding direction at a pitch different from the pitch d. The pitch along the light-guiding direction is referred to as a surface pitch.

In the incident diffraction optical element 33 and the emission diffraction optical element 35, the angle of incident light differs depending on positions in the light-guiding direction. With regard to the light reaching the emission diffraction optical element 35 from the incident diffraction optical element 33 while repeating total reflection inside the light-guiding body 31, image light, which is diffracted at a position of the emission diffraction optical element 35 on a side closest to the incident diffraction optical element 33 and reaches the eye EY of an observer, and image light, which is diffracted at a position of the emission diffraction optical element 35 on a side farthest from incident diffraction optical element 33 and reaches the eye EY of an observer, have different diffraction angles. This difference is illustrated in FIG. 2 as a difference in angle of view of the image light entering the incident diffraction optical element 33 from the display 51 and an angle of view of the image light entering the eye EY from the emission diffraction optical element 35. A property of the emission diffraction optical element 35, that is, a relationship between a wavelength and a diffraction angle satisfying Expression (1) is designed by the angle of view θc of the image light at the center position.

The incident angles θ− and θ+ in FIG. 2 is regarded as a deviation from the center angle of view θc of the image light at the center position.

When the position at which the image light enters the emission diffraction optical element 35 in the light-guiding direction differs, the angle of view differs. Here, it is assumed that a property of the emission diffraction optical element 35 is designed so as to satisfy Expression (1) given above with respect to a predetermined color (reference wavelength λ) at the incident angle θc at the center position of the emission diffraction optical element 35 in the light-guiding direction. In this case, at the angles of view θ− and θ+ at the positions of both the ends of the emission diffraction optical element 35, Expression (1) is not necessarily satisfied. When the image light entering both the ends of the emission diffraction optical element 35 at the angles of view θ− and θ+ satisfies Expression (1), the wavelength of the image light is different from the wavelength at the center position satisfying Expression (1).

Figure 5:
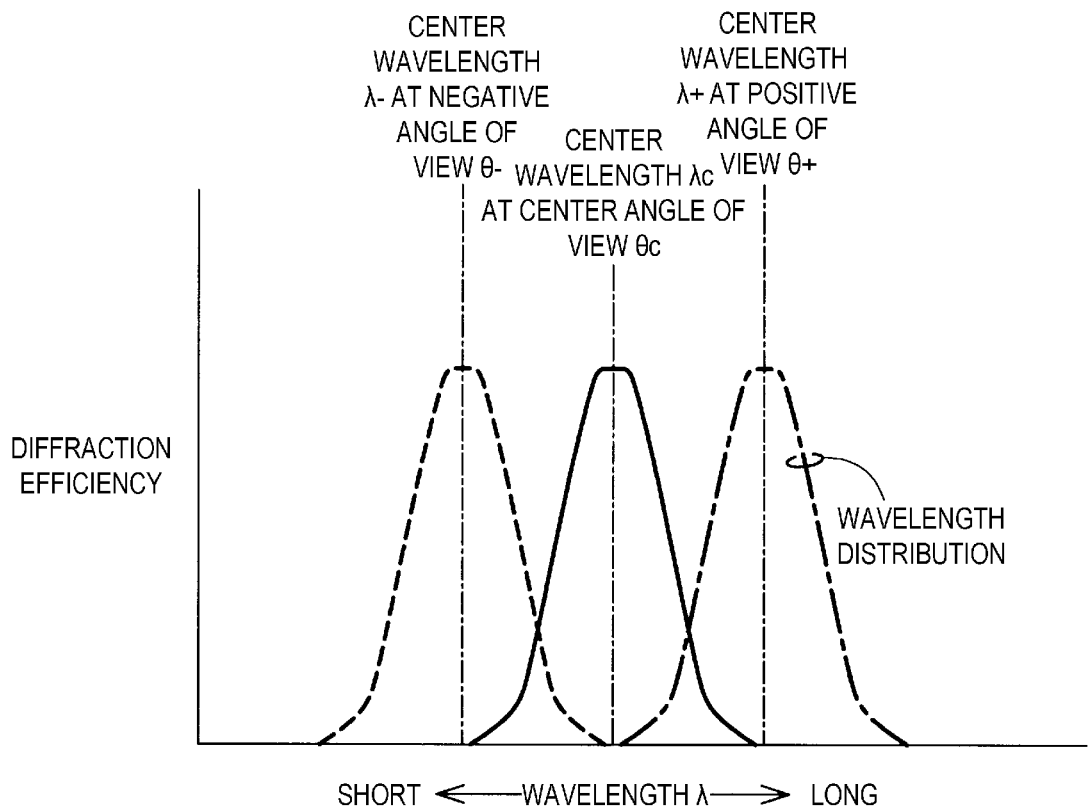
FIG. 5 is an explanatory view illustrating a wavelength with peak diffraction efficiency at each angle.

This state is exemplified in FIG. 5. FIG. 5 illustrates a degree at which the wavelength satisfying Expression (1) is shifted when the incident angle is increased or reduced by 5° with respect to the center angle of view θc at the center position of the emission diffraction optical element 35. When light having a center wavelength λc is emitted at the center angle of view θc while satisfying Expression (1), diffraction efficiency of the light within the wavelength range is degraded, and intensity of the diffracted light is lowered as the angle of view is increased or reduced from the center angle of view. As illustrated in FIG. 5, light satisfying Expression (1) at the negative angle of view θ− and the positive angle of view θ+ is shifted to a short wavelength side and a long wavelength side, respectively. FIG. 5 illustrates a case where the angle of view is increased and reduced by 5° with respect to the center angle of view θc of the emission diffraction optical element 35. When the incident angle is increased and reduced by a smaller amount, that is, at an angle closer to the center angle of view, deviation in wavelength with peak diffraction efficiency is small, and reduction in diffraction efficiency of the image light having a wavelength falling within the same range is small. In contrast, with respect to the center angle of view θc of the emission diffraction optical element 35, when the incident angle is increased and reduced by a larger amount, that is, at a position at which the angle of view is inclined further largely, deviation in wavelength with peak diffraction efficiency is large, and reduction in diffraction efficiency of the image light having a wavelength falling within the same range is large.

Figure 6:
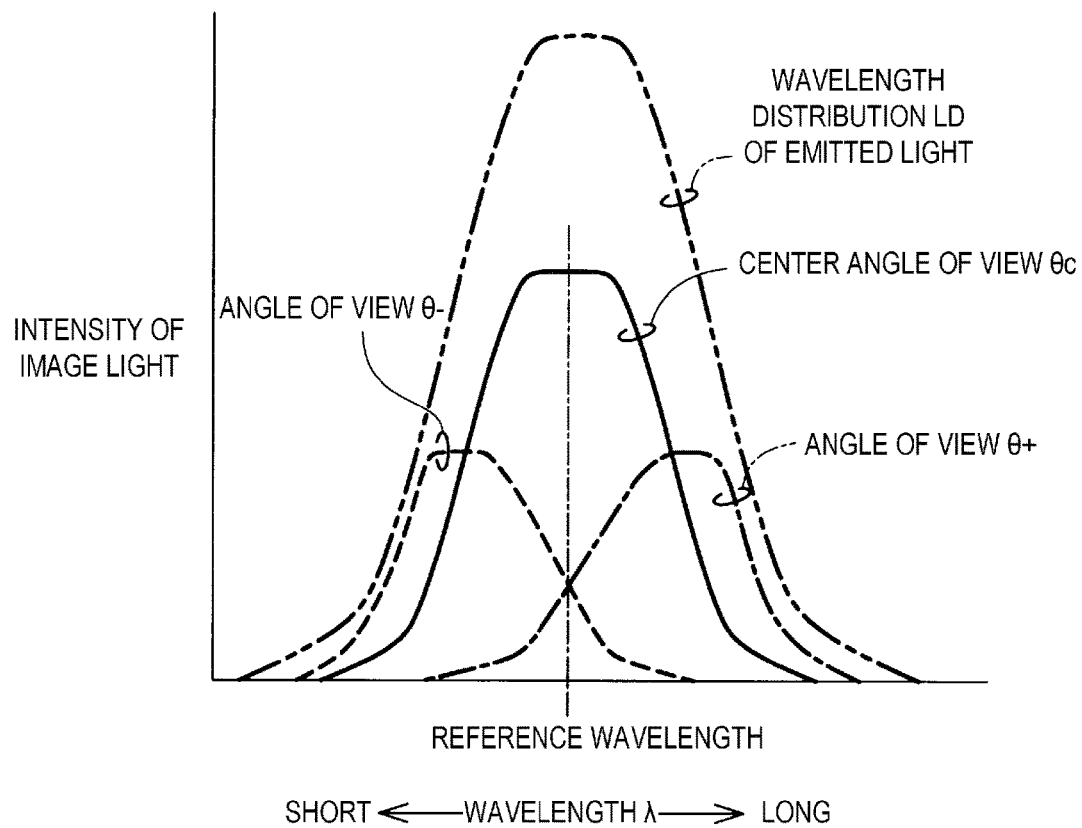
FIG. 6 is an explanatory view illustrating a state in which intensity of image light fluctuates depending on an angle of view of an image to be formed.

When it is assumed that all the light emitting diodes EL11 to ELmn of the display 51 have completely the same light emitting property, that is, have the same wavelength range and the center wavelength of light emission, as illustrated in FIG. 6, light of wavelength distribution LD of light emission enters the incident diffraction optical element 33 and the emission diffraction optical element 35 from the display 51. In this case, the center angle of view θc is designed to satisfy Expression (1) given above, and hence intensity of the image light having the center wavelength of the incident light (reference wavelength) is maximized. In contrast, at the negative angle of view θ− and the positive angle of view θ+, a diffraction angle α, that is, a magnitude of deflection differs, and hence a wavelength λ that satisfies Expression (1) differs. A wavelength of the image light with the highest intensity is shifted to a short wavelength side and a long wavelength side at the negative angle of view θ− and the positive angle of view θ+, respectively. Moreover, as schematically illustrated in FIG. 6, the wavelength distribution LD of the light emitted from each of the light emitting diodes ELij of the display 51 is reduced as being deviated from the reference wavelength. Thus, intensity of the image light at the negative angle of view θ− and the positive angle of view θ+ is largely lowered as compared to that at the center angle of view θc. As a result, intensity (brightness) of a two-dimensional image on the display 51 is gradually reduced in a direction from the center to the angle of view θ− or θ+.

In contrast, on the display 51 in the present exemplary embodiment, not all the light emitting diodes ELij emit light with the wavelength distribution LD in the same wavelength range. Instead, as illustrated in FIG. 3, in the longitudinal direction of the light-guiding body 31, the light emitting diodes at the corresponding positions emit light on a short wavelength side as approaching to the negative angle of view θ−, and the light emitting diodes at the corresponding positions emit light on a long wavelength side as approaching to the positive angle of view θ+. Therefore, even at the negative angle of view θ− or the positive angle of view θ+, diffraction efficiency with respect to incident light is maintained to a degree equivalent to diffraction efficiency at the center angle of view θc. As a result, intensity of the emitted image light is also maintained to a degree equivalent to that at the center angle of view θc.

Figure 7:
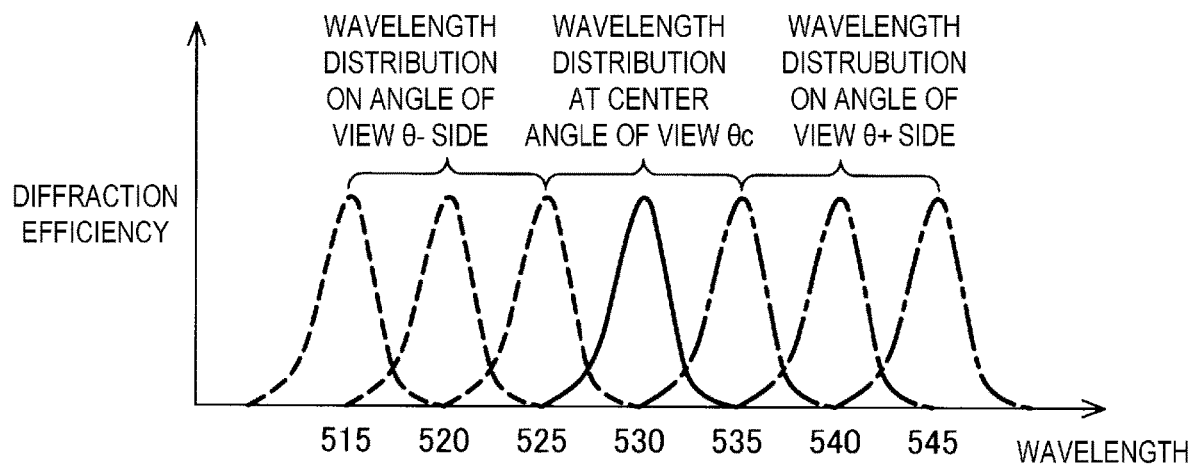
FIG. 7 is an explanatory view illustrating a state of suppressing fluctuation in diffraction efficiency due to an angle of view.

FIG. 7 is an explanatory view illustrating this state. In a range in which the angle of view is shifted from the negative angle of view θ− to the positive angle of view θ+ via the center angle of view θc, diffraction efficiency at the incident diffraction optical element 33 or the emission diffraction optical element 35 differs for each wavelength. FIG. 7 illustrates wavelength distribution of light with peak diffraction efficiency at each angle of view. As a matter of course, light emitted from each light emitting diode EL of the display 51 includes a center wavelength that differs for each angle of view, and has a center wavelength that differs further finely as compared to the light of the wavelength distribution illustrated in FIG. 7. FIG. 7 exemplifies light of wavelength distribution of seven center wavelengths from a center wavelength of 515 nm to a center wavelength of 545 nm. In the illustrated example of FIG. 7, for convenience of easy understanding, illustration is given by assuming that diffraction efficiency of light with the wavelength λ=525 to 535 nm has a peak near at the center angle of view θc, that diffraction efficiency of light with the wavelength λ=515 to 525 nm has a peak near at the negative angle of view θ−, and that diffraction efficiency of light with the wavelength λ=535 to 545 nm has a peak near at the positive angle of view θ+.

A light emittance wavelength of a light emitting diode can be adjusted with a certain range by a semiconductor material of the light emitting diode and design such as design for a difference in energy level of an electron before and after recombination. Further, a light emission wavelength depends on a temperature and a current value of a semiconductor joint portion. By utilizing such matters, the light emitting diodes ELij having slightly different wavelengths as described above can be produced. A filter having a different transmittance wavelength and transmittance is combined with light emitting diodes having the same light emittance wavelength so as to obtain a display having even intensity of light and different wavelengths. As a matter of course, the display 51 thus obtained may be adopted.

With the display device 20 according to the first exemplary embodiment described above, in the display 51 that displays a green (the center wavelength of 530 nm) image, the light emitting diodes EL on the display 51 have different center wavelengths of light emission wavelengths in accordance with a corresponding angle of view of image light on the incident diffraction optical element 33 and the emission diffraction optical element 35. Specifically, at the negative angle of view θ−, the center wavelength is shifted to a short wavelength side. At the positive angle of view θ+, the center wavelength is shifted to a long wavelength side. Thus, at the center angle of view θc or even in the ranges to both the end portions, diffraction efficiency of incident light is prevented from being reduced depending on an angle of view on the incident diffraction optical element 33 and the emission diffraction optical element 35. As a result, intensity of image light that is formed on the display 51, reaches the emission diffraction optical element 35 from the incident diffraction optical element 33 through the light-guiding body 31, is diffracted at the emission diffraction optical element 35, and enters the eye EY of the observer does not change largely at the center angle of view θc or at the negative angle of view θ− and the positive angle of view θ+. Thus, the image can be prevented from being darker near the periphery.

C. Second Exemplary Embodiment

Figure 8:
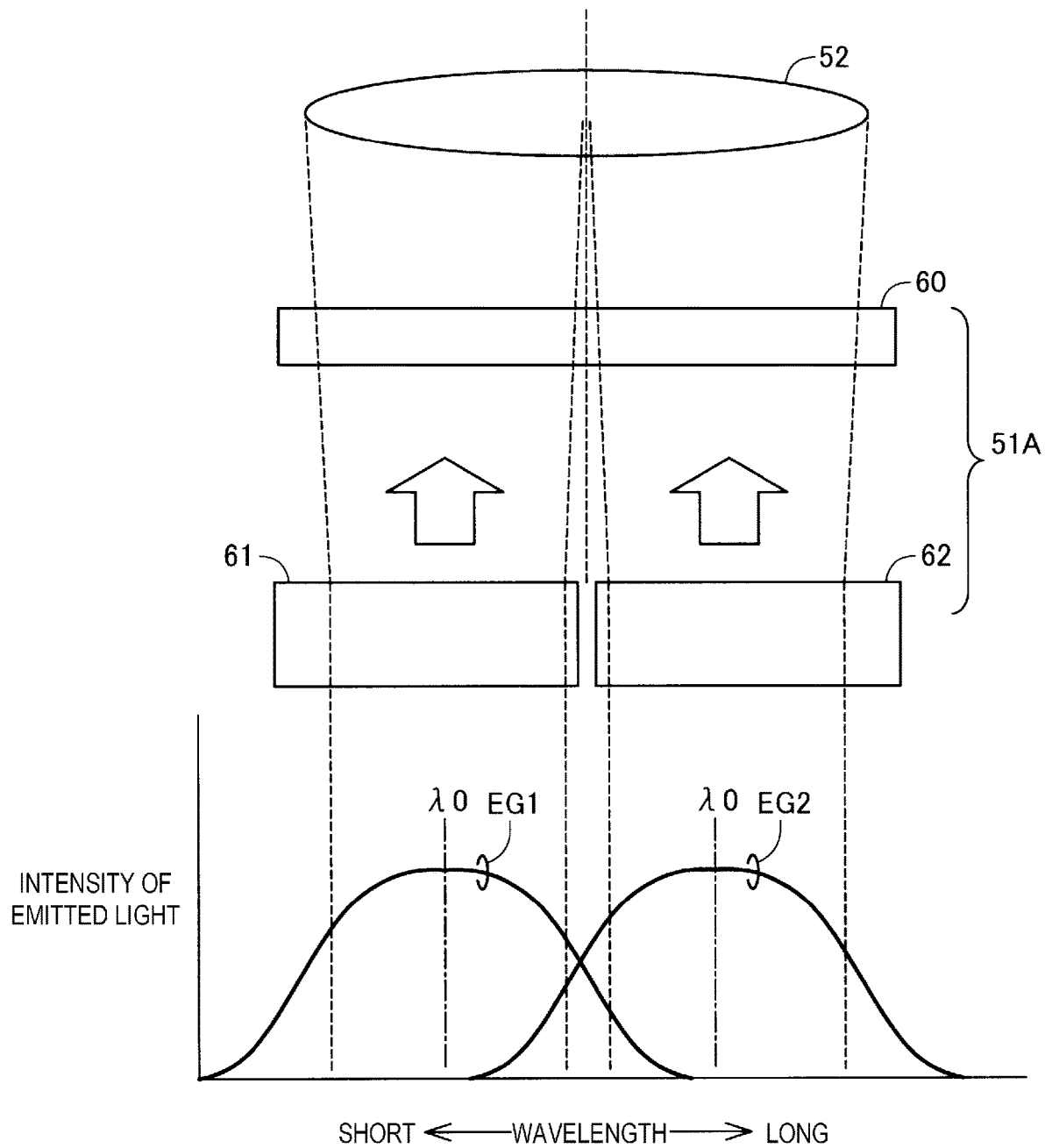
FIG. 8 is a schematic configuration view of a display in a second exemplary embodiment.

Next, description is made on a second exemplary embodiment. FIG. 8 illustrates a configuration of a display 51A of the display device 20 according to the second exemplary embodiment. The display device 20 according to the second exemplary embodiment has a configuration substantially similar to that in the first exemplary embodiment except for the display 51A. As illustrated in FIG. 8, the display 51A of the display device 20 according to the second exemplary embodiment includes a display body 60 having a shutter function and light sources 61 and 62. In the present exemplary embodiment, light emitting diodes having different center wavelengths of light emission wavelengths are used for the light sources 61 and 62. Light from the light sources 61 and 62 passes through or is blocked by turning on/off the display body 60. A signal from the image formation unit 39 is input to the display body 60. Then, a plurality of shutter elements provided to the display body 60 are driven to form an image. Note that, in the present exemplary embodiment, liquid crystal is used for the shutter elements. However, the shutter elements are not limited to liquid crystal, and may be fine Kerr cells as long as light from the light sources 61 and 62 is turned on/off. Further, a reflective display body such as a digital mirror device (DMD) may be adopted. As the light sources, in addition to the light emitting diodes, electric-discharge lamps, OLEDs, lasers, and the like may be adopted.

Figure 9:
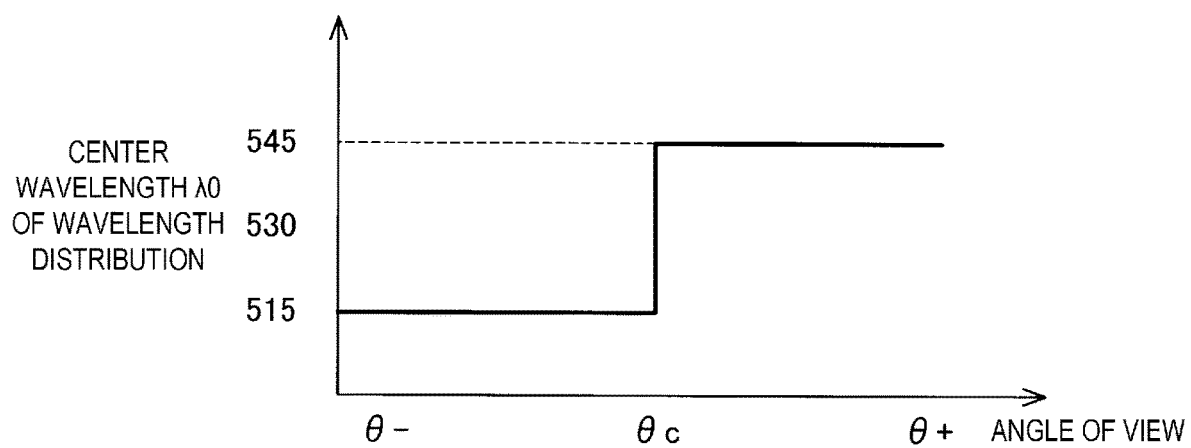
FIG. 9 is an explanatory view illustrating a relationship of an angle of view and a center frequency of light from a light source.

In the present exemplary embodiment, the light sources 61 and 62 are configured as two light sources having different center wavelengths λ. As illustrated in FIG. 8, in the present exemplary embodiment, the center wavelength λ0 of the light source 61 has a peak on a short wavelength side with respect to the center wavelength λ0 of the light source 62. The center wavelength λ0 of the light source 61 is 515 nm, and the center wavelength λ0 of the light source 62 is 545 nm. In FIG. 8, the lowest part describes wavelength distribution EG1 of the light source 61 and wavelength distribution EG2 of the light source 62. However, the direction of the wavelength distribution does not necessarily correspond to a position in each light source. The light sources 61 and 62 as a whole have wavelength distribution described in the lowest part. This is illustrated in FIG. 9. As in the illustrated example, in the second exemplary embodiment, at the angle of view θ− on the negative side with respect to the center angle of view θc, light from the light source 61 having a center wavelength of 515 nm enters the display body 60. At the angle of view θ+ on the positive side with respect to the center angle of view θc, light having a center wavelength of 545 nm enters the display body 60. The light sources 61 and 62 have the predetermined wavelength distribution EG1 and the predetermined wavelength distribution EG2, respectively. Thus, in the periphery of the center angle of view θc, light having a wavelength of 530 nm with peak diffraction efficiency enters from both the light sources 61 and 62 at the center angle of view θc.

As a result, in the second exemplary embodiment, on the display body 60 forming the display 51A, light from the light source 61 having the center wavelength λ0 on a short wavelength side mainly enter a side from the center angle of view θc to the negative angle of view θ−, and light from the light source 62 having the center frequency λ0 on a long wavelength side enters at the positive angle of view θ+. Thus, image light that is formed on the display body 60 and enters the incident diffraction optical element 33 and image light that enters the emission diffraction optical element 35 through the light-guiding body 31 contain light having a wavelength with high diffraction efficiency at an incident angle of view. As a result, image light entering the eye EY of the observer is suppressed in fluctuation of intensity on the display surface of the display body 60 due to an angle of view, particularly, excessive reduction in intensity near the edges.

Figure 10A:
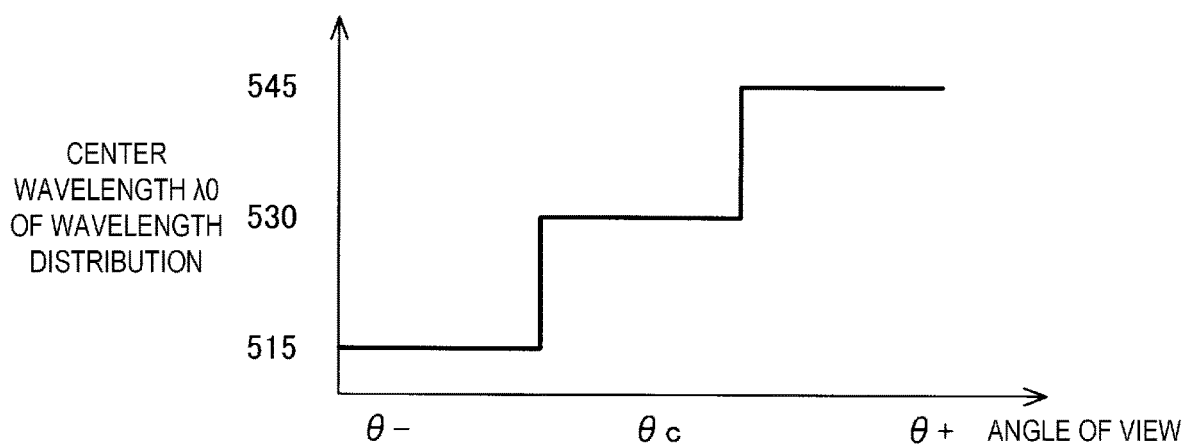
FIG. 10A is an explanatory view illustrating a relationship an angle of view and a center frequency of light from light sources in a case where the number of light sources is three.

In the present exemplary embodiment, the center wavelength of the light entering the display body 60 is divided into two sides, namely, a short wavelength side and a long wavelength side in accordance with the two light sources 61 and 62. However, the number is not limited to two, and the center wavelength may be divided into three or more. For example, FIG. 10A illustrates a relationship between an angle of view and the center wavelength λ0 in a case of dividing the center wavelength into three. In this example, the center wavelength λ0 of the wavelength distribution of the light source near at the center angle of view θc is 530 nm, the center wavelength λ0 of the wavelength distribution of the light source on the negative angle of view θ− side with respect to the center angle of view θc is 515 nm, and the center wavelength λ0 of the wavelength distribution of the light source on the positive angle of view θ+ side with respect to the center angle of view θc is 545 nm.

Figure 10B:
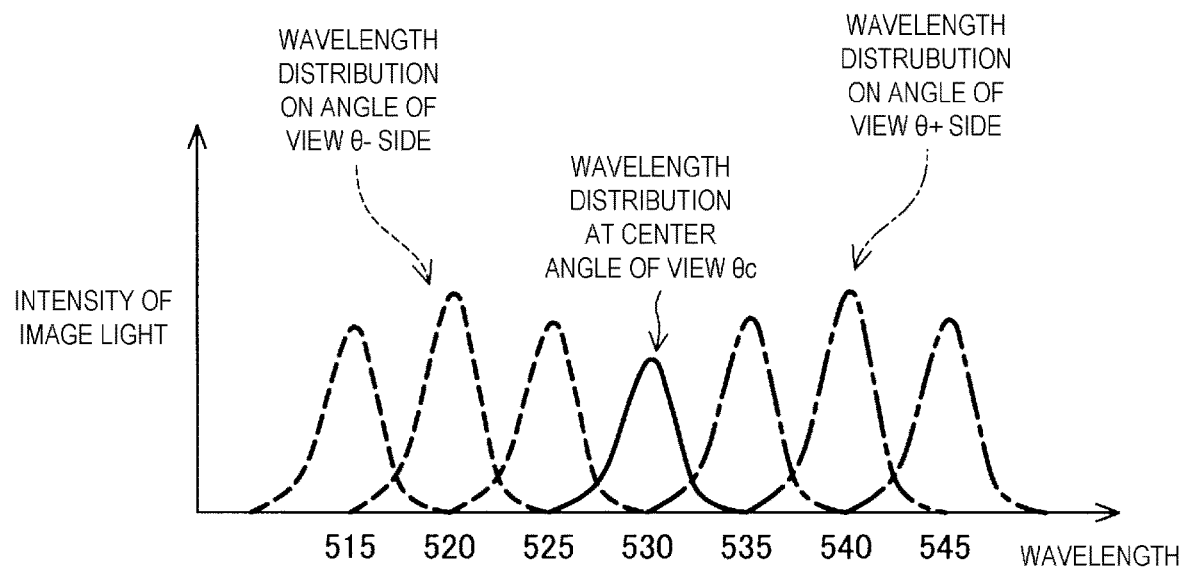
FIG. 10B is an explanatory view illustrating a state in which differences in diffraction efficiency for an angle of view are suppressed and variation of intensity of image light is suppressed.

In a case of using such light source, intensity of light on a short wavelength side with high diffraction efficiency at the negative angle of view θ− and intensity of light on a long wavelength side with high diffraction efficiency at the positive angle of view θ+ can be increased to be substantially equivalent to intensity of light having a wavelength (530 nm) with high diffraction efficiency at the center angle of view θc. This state is exemplified in FIG. 10B. In accordance with FIG. 7, FIG. 10B illustrates seven types of light having center wavelength of from 515 nm to 545 nm as light of the predetermined wavelength distribution. Even when the number of light sources is three, similarly to a case of the two light sources illustrated in FIG. 8, each light source includes light having three wavelength ranges of a short wavelength side, a long wavelength side, and an intermediate therebetween. Therefore, in such case, intensity unevenness of image light on the two-dimensional display surface of the display 51A, particularly, a phenomenon that intensity of image light is reduced as approaching from the center to both the edges in the light-guiding direction can be prevented from being caused.

Figure 10C:
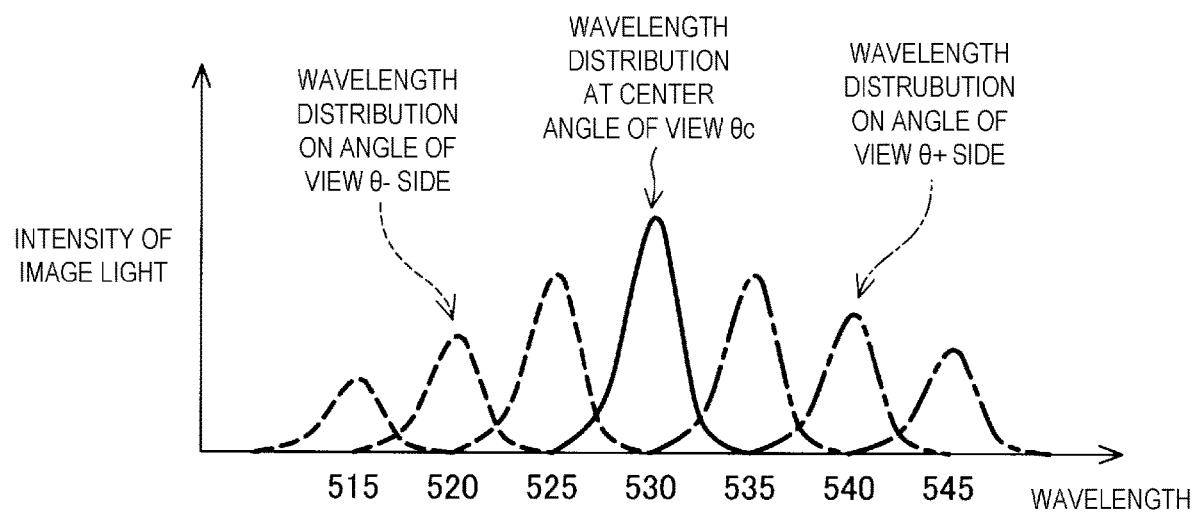
FIG. 10C is an explanatory view illustrating a state in which variation is caused in intensity of image light because of differences in diffraction efficiency for an angle of view.

In contrast, when such light source is not used, as illustrated in FIG. 10C, intensity of light on a short wavelength side with high diffraction efficiency at the negative angle of view θ− and intensity of light on a long wavelength side with high diffraction efficiency at the positive angle of view θ+ is lower than intensity of light having a wavelength (530 nm) with high diffraction efficiency at the center angle of view θc. Thus, with regard to light entering the eye EY of the observer, within a formation range of the image, intensity of the image light is lowered as the negative angle of view θ− or the positive angle of view θ+ is increased. In the present exemplary embodiment, a problem of such reduction in intensity of image light due to a difference in angle of view can be prevented from being caused.

In the exemplary embodiment described above, the light emitting diodes having different peak wavelengths of the light emission wavelengths are adopted as the light sources 61 and 62. Alternatively, a single light emitting body having a comparatively wide light emittance wavelength range may be used as the light sources 61 and 62, and a filter different from a transmittance wavelength range may be provided between the light sources 61 and 62, and the display body 60 so as to obtain different center wavelengths of light emitted from the light sources 61 and 62. In this case, the filter may be arranged between the light source such as light emitting diodes and the display body 60, on the display body 60 on an emission side, or both between the light source and the display body and on the display body on the emission side.

D. Third Exemplary Embodiment

Figure 11:
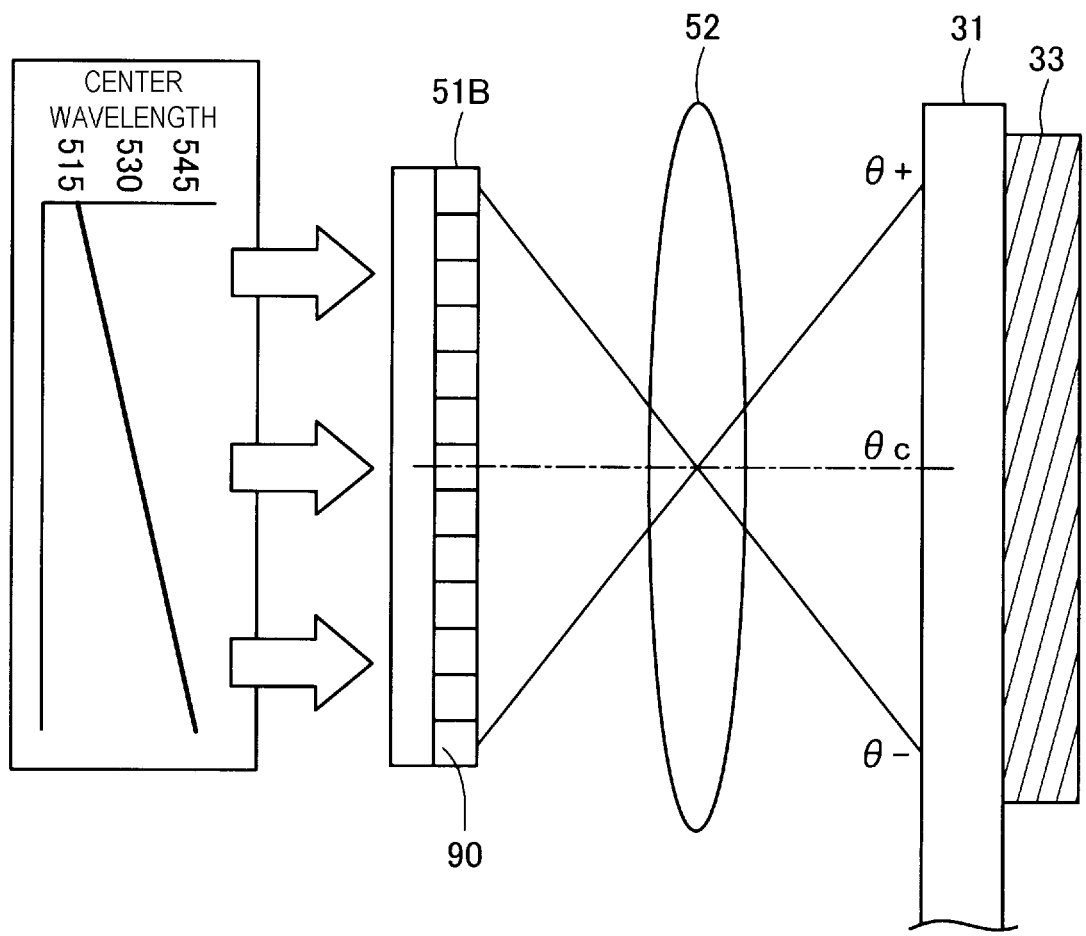
FIG. 11 is an explanatory view illustrating a relationship of an angle of view and a center frequency of a display in a third exemplary embodiment.

Next, description is made on a third exemplary embodiment. The display device 20 according to the third exemplary embodiment has an overall configuration similar to those in the first exemplary embodiment and the second exemplary embodiment, and has a display having a configuration different therefrom. FIG. 11 illustrates a display 51B in the third exemplary embodiment and the periphery thereof. Similarly to the first exemplary embodiment, the display 51B in the third exemplary embodiment includes a configuration in which optical elements that emit light having different center wavelengths are arrayed on the two-dimensional surface of the display 51B. In the third exemplary embodiment, in place of the light emitting diodes EL, OLEDs 90 are arrayed. Similarly to the light emitting diodes in the first exemplary embodiment, as illustrated in FIG. 11, center wavelengths of light emission of the plurality of OLEDs are 515 nm at an end on the negative angle of view θ− side, 530 nm at the center angle of view θc, and 545 nm at an end on the positive angle of view θ+ side.

Figure 12:
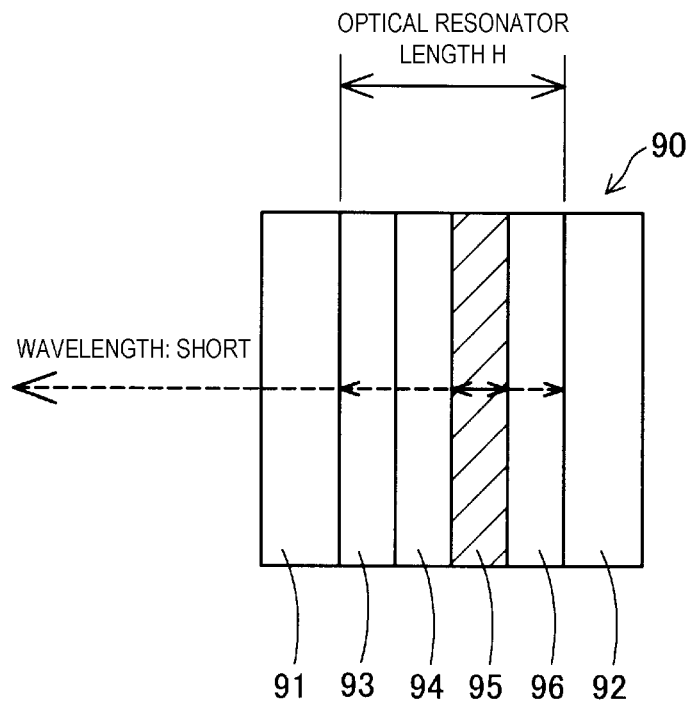
FIG. 12 is an explanatory view illustrating a configuration of an OLED in the third exemplary embodiment.
Figure 13:
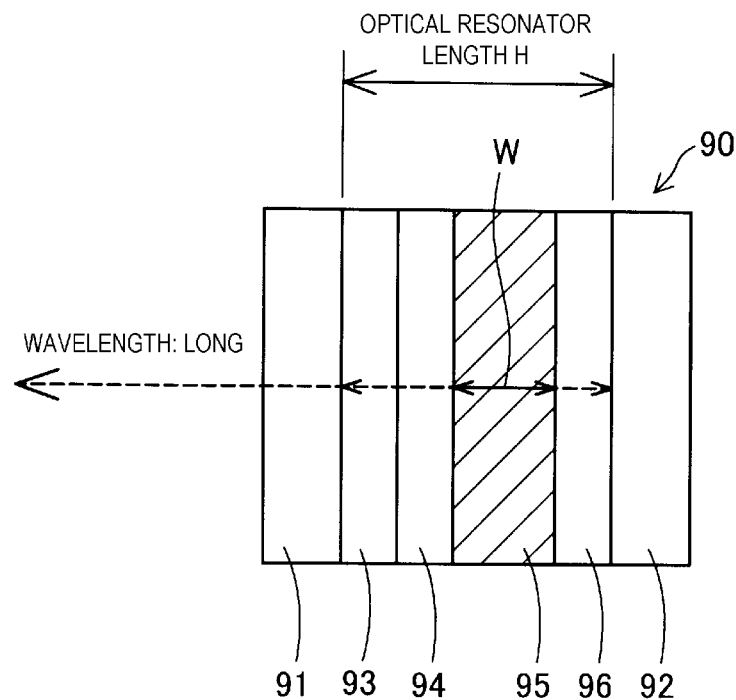
FIG. 13 is an explanatory view illustrating a state in which an optical resonator length of the OLED differs.

As illustrated in FIG. 12, adjustment of the center wavelength of light emission of the OLED 90 can be performed easily by adjusting a length H of an optical resonator incorporated in the OLED 90. As illustrated in FIG. 12, the OLED 90 includes, between a transparent substrate 91 on a side that light enters and a substrate 92 on the opposite side, a cathode 93, an organic light emitting layer 94, an optical adjustment layer 95, and a reflective layer 96 in the stated order from the transparent substrate 91 side. Of those layers, the layers between an inner end surface of the transparent substrate 91 and a front surface of the reflective layer 96 function as an optical resonator. Light emitted from the organic light emitting layer 94 is repeatedly reflected in the optical resonator, and is emitted to the outside as light having a wavelength determined with an optical resonator length H. As in the illustrated example in FIG. 13, the optical resonator length H may be adjusted with a physical width W of the optical adjustment layer 95, or may be adjusted by a refractive index of the optical adjustment layer 95. This is because an optical distance of the optical adjustment layer 95 is regarded as a distance obtained by multiplying the actual width W by a refractive index η.

Figure 14:
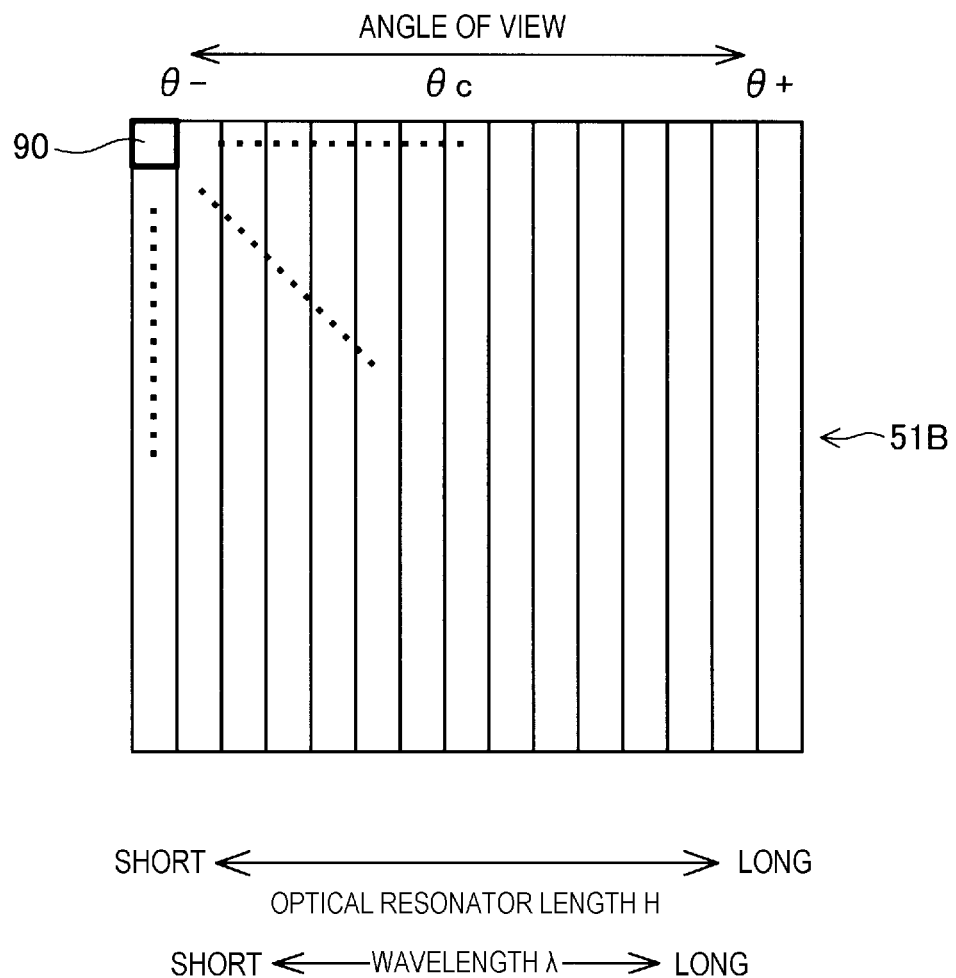
FIG. 14 is an explanatory view illustrating arrangement of the OLEDs in the display in the third exemplary embodiment.

FIG. 14 exemplifies a state of arrangement of the OLEDs 90 on the display 51B in the third exemplary embodiment. In FIG. 14, the plurality of OLEDs 90 are omitted in illustration except for one upper left OLED 90. In the horizontal direction of the display 51B, that is, in a range of the light-guiding body 31 from the negative angle of view θ− to the positive angle of view θ+ in the light-guiding direction, the OLEDs 90 are arrayed so that, on the negative angle of view θ− side, the optical resonator length H is shorter and thus the center wavelength λ0 is shorter and that, on the positive angle of view θ+ side, the optical resonator length H is longer and thus the center wavelength λ0 is longer. Thus, similarly to the first exemplary embodiment, when image light of an image formed on the two-dimensional display surface of the display 51B is diffracted by the incident diffraction optical element 33 or the emission diffraction optical element 35, light having a center wavelength with high diffraction efficiency enters at each angle of view. Thus, variation of intensity of the image formed on the display 51B is suppressed on the two-dimensional display surface. Particularly, a phenomenon that intensity of an image is reduced as approaching to the negative angle of view θ− or the positive angle of view θ+ is suppressed.

In the third exemplary embodiment, a center wavelength of each OLED 90 is adjusted with an optical distance H of the optical resonator. Thus, an advantageous point that adjustment of the center wavelength is facilitated can also be obtained. A wavelength of light with peak diffraction efficiency at a position of each angle of view is obtained from Expression (1) given above, and the center wavelength λ0 of light emission of each OLED 90 is accurately adjusted. In this manner, brightness of an image formed on the display 51B can be substantially even.

E. Fourth Exemplary Embodiment

Figure 15:
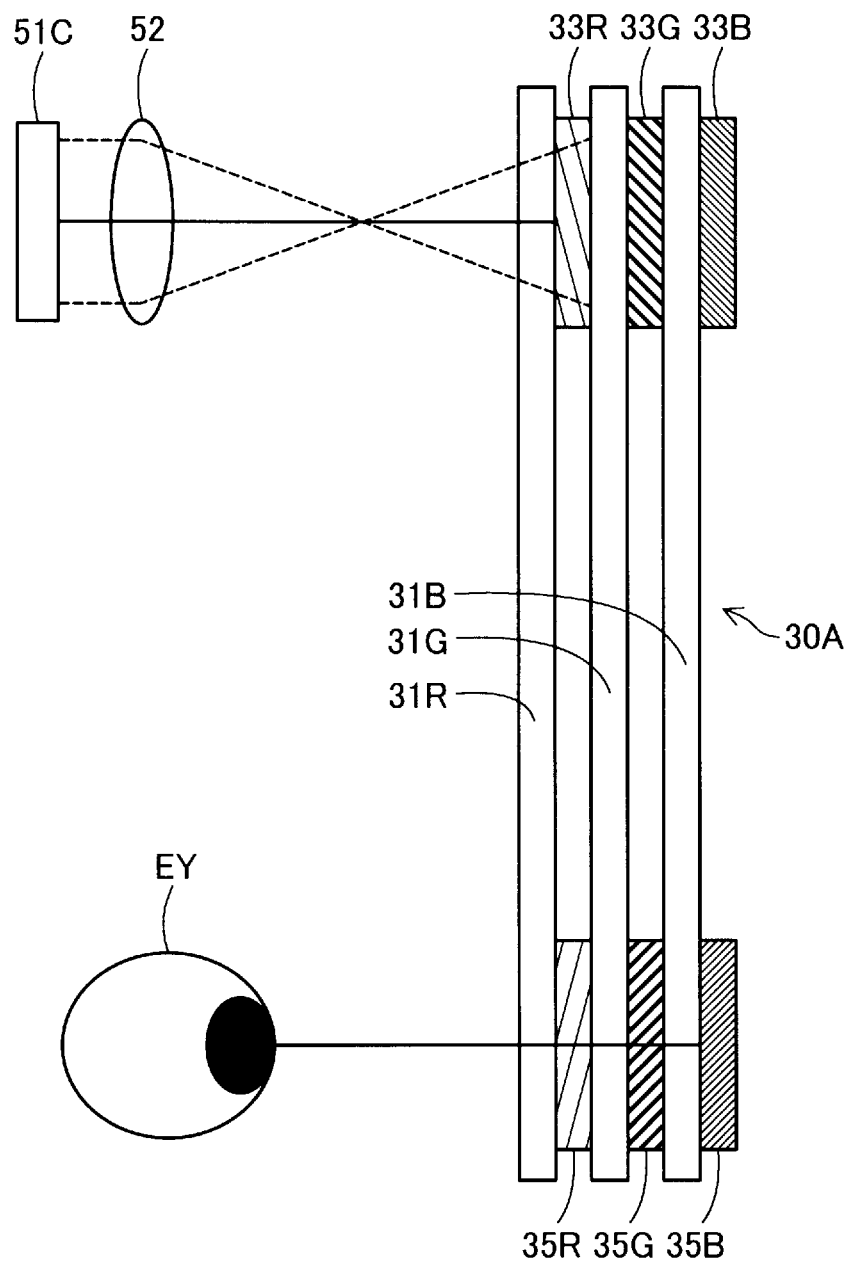
FIG. 15 is an explanatory view schematically illustrating a configuration of a left-eye display unit in a fourth exemplary embodiment.

Next, description is made on a fourth exemplary embodiment. The display device 20 according to the fourth exemplary embodiment has a principle basically similar to those in the first exemplary embodiment to the third exemplary embodiment except for displaying a full color image. FIG. 15 illustrates a configuration example of a left-eye display unit 30A in the fourth exemplary embodiment. Note that the right-eye display unit includes a similar configuration.

As illustrated in FIG. 15, the left-eye display unit 30A includes a display 51C that forms a full color image, and light-guiding paths that guide image light of red (R) corresponding to a first image light, image light of green (G) corresponding to a second image light, and image light of blue (B) corresponding to a third image light, which are emitted from the display 51C, respectively. That is, the display 51C is capable of emitting light of red (R), green (G), and blue (B) per pixel unit, and the left-eye display unit 30A includes three light-guiding paths that separately guide the image light of red (R), green (G), and blue (B). The light-guiding path for red light R is formed of an incident diffraction optical element 33R, a light-guiding body 31R, and an emission diffraction optical element 35R. The light-guiding path for green light G is formed of an incident diffraction optical element 33G, a light-guiding body 31G, and an emission diffraction optical element 35G. The light-guiding path for blue light B is formed of an incident diffraction optical element 33B, a light-guiding body 31B, and an emission diffraction optical element 35B. The left-eye display unit 30A has a configuration of overlapping those three light-guiding paths. Even when the light-guiding paths overlap one another as described above, light other than light having a wavelength that is designed to be diffracted passes through the diffraction optical element. Thus, for example, among the light of the colors RGB, the light of B passes through the incident diffraction optical element 33R for R and the incident diffraction optical element 33G for G that are present on the display 51C side, and reaches the incident diffraction optical element 33B for B. Among the light of the colors RGB, the light of G also passes through the incident diffraction optical element 33R that is present in front.

The display 51C emit the first image light to the third image light (RGB) corresponding to the three primary colors to the left-eye display unit 30A having such configuration. Similarly in the first exemplary embodiment, each of the red image light (R), the green image light (G), and the blue image light (B) is shifted to a short wavelength side at the negative angle of view θ− and to a long wavelength side at the positive angle of view θ+ as compared to a center wavelength at the center angle of view θc. This state is exemplified in FIG. 16.

Figure 16:
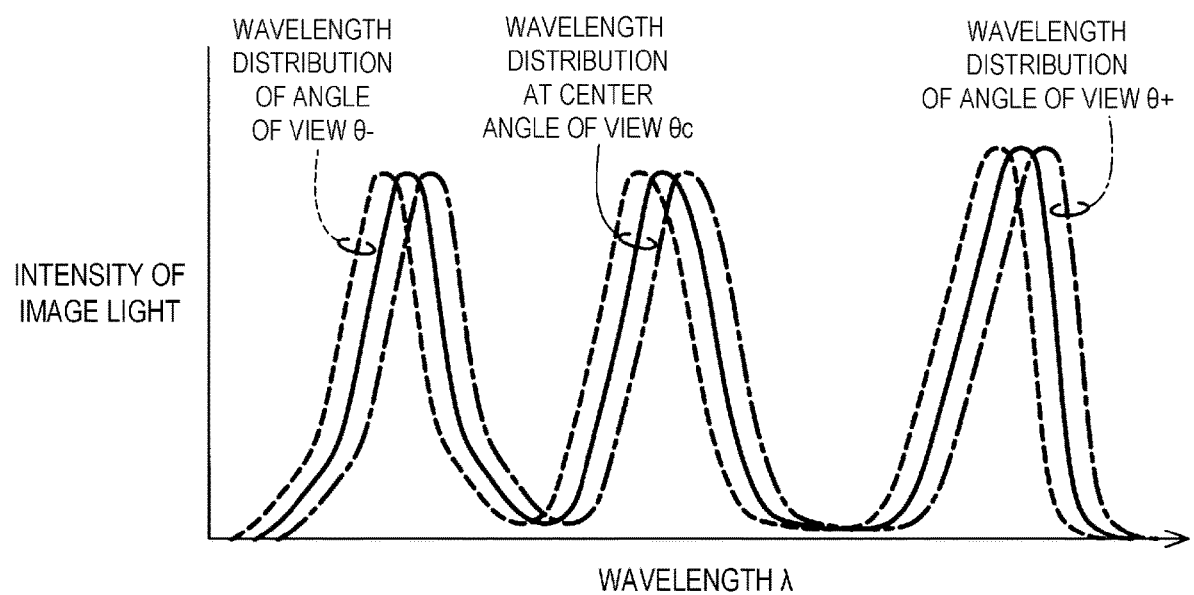
FIG. 16 is an explanatory view illustrating wavelength distribution of each angle of view of three primary colors (RGB).

In FIG. 16, the solid line indicates wavelength distribution of image light near at the center angle of view θc. The display 51C emit the image light (RGB) of the three primary colors, and hence wavelength distribution has a peak corresponding to blue (B) on the left side, a peak corresponding to green (G) near at the center, and a peak corresponding to red (R) on the right side. With respect to such wavelength distribution, a broken line and a one-chain dotted line indicate wavelength distribution of image light at the negative angle of view θ− and wavelength distribution of image light at the positive angle of view θ+, respectively.

As in the illustrated example, with respect to image light near at the center angle of view θc, wavelength distribution of image light at the negative angle of view θ− is shifted to a short wavelength side, and wavelength distribution of image light at the positive angle of view θ+ is shifted to a long wavelength side. The peak corresponding to green (G) has a similar relationship of wavelength distribution of image light at the center angle of view θc, the negative angle of view θ−, and the positive angle of view θ+, which is described in the first exemplary embodiment to the third exemplary embodiment. Further, the other primary colors such as red (R) and blue (B) also have wavelength distribution that is similarly shifted.

As a result, in the fourth exemplary embodiment, similarly to the description on green (G) in the first exemplary embodiment to the third exemplary embodiment, with respect to a wavelength of light on the two-dimensional display surface of the display 51C for each of the three primary colors, image light in any of the hues RGB is shifted to a short wavelength side and to a long wavelength side due to a difference in angle of view as compared to wavelength distribution at the center angle of view θc. As a result, unevenness of intensity of image light at each angle of view, which enters the eye EY of the observer, is suppressed. That is, in a full color image visually recognized by an observer, reduction in intensity is suppressed even as approaching to the edges in the light-guiding direction.

Further, the left-eye display unit 30A illustrated in FIG. 15 guides the primary three colors RGB from the display 51 to the eye EY of an observer through the three light-guiding paths that are independently prepared correspondingly to the light of the respective colors, and hence is capable of displaying a full color image efficiently.

Figure 17:
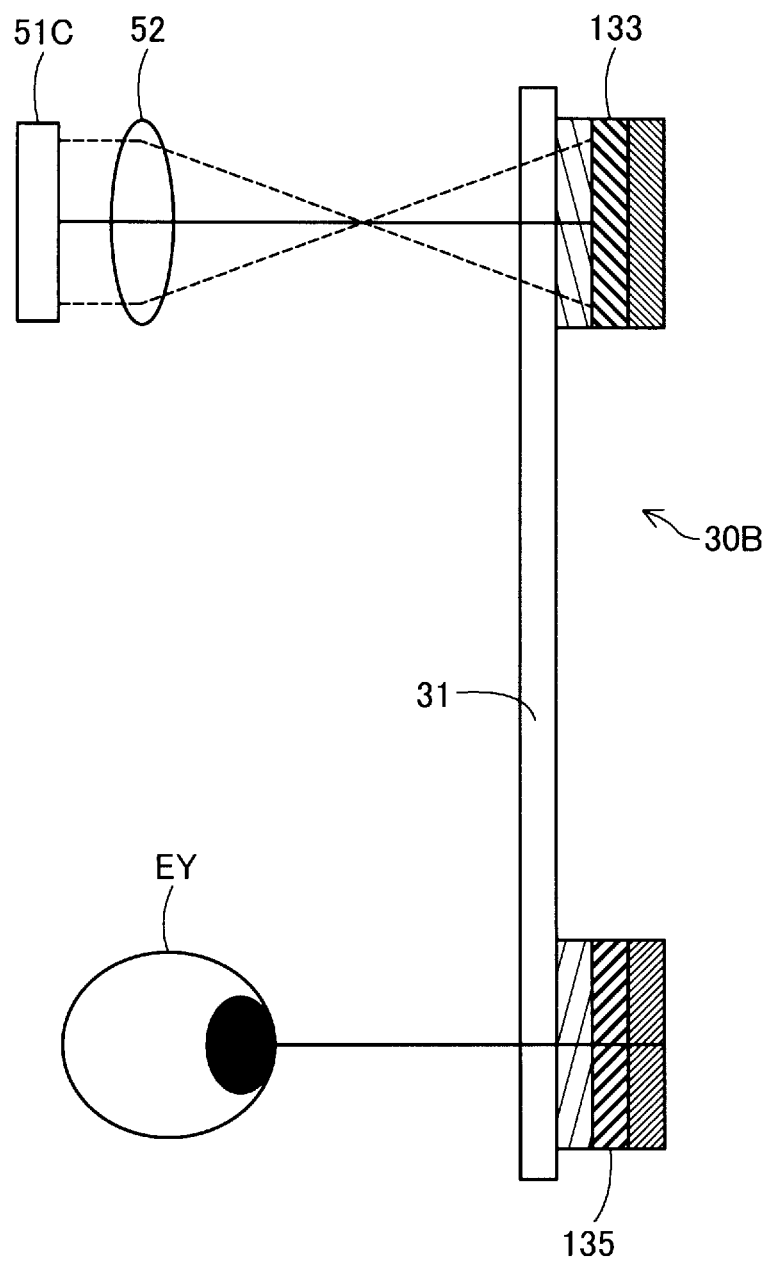
FIG. 17 is an explanatory view illustrating arrangement of an optical system in other exemplary embodiments.

In the exemplary embodiment described above, for each of the colors RGB, the independent light-guiding path formed of the incident diffraction optical element, the light-guiding body, and the emission diffraction optical element is prepared in accordance with a wavelength of each color. Alternatively, the light-guiding bodies may be integrated. FIG. 17 is an explanatory view schematically illustrating a configuration of a left-eye display unit 30B as diffraction optical elements and light-guiding bodies in a further different exemplary embodiment. The right-eye display unit includes a similar configuration. The left-eye display unit 30B guides the primary three colors RGB, which form a full color image on the display 51C similarly to that in the fourth exemplary embodiment described above, to the eye EY of an observer through the same one light-guiding path.

Similarly to the fourth exemplary embodiment, the display 51C is capable of emitting light of red (R), green (G), and blue (B) per pixel unit, and emits the image light of red (R) corresponding to the first image light, the image light of green (G) corresponding to the second image light, and the image light of blue (B) corresponding to the third image light. Further, similarly to the fourth exemplary embodiment, in the display 51C, with respect to image light near at the center angle of view θc, wavelength distribution of image light at the negative angle of view θ− is shifted to a short wavelength side, and wavelength distribution of image light at the positive angle of view θ+ is shifted to a long wavelength side.

The left-eye display unit 30B includes, on the one light-guiding body 31, an incident diffraction optical element 133 for the three primary colors RGB and an emission diffraction optical element 135 for the three primary colors RGB. The incident diffraction optical element 133 and the emission diffraction optical element 135 are obtained by laminating or superposing diffraction optical elements for the three primary colors RGB. However, light other than light having a wavelength that is designed to be diffracted passes through the diffraction optical element, and hence the light of the respective colors arrives at the positions of the corresponding diffraction optical elements. The left-eye display unit 30B illustrated in FIG. 17 guides the three primary colors RGB from the display 51 to the eye EY of an observer through the one light-guiding body 31 prepared for the light of the respective colors in a collective manner. Thus, the device configuration can be reduced in thickness. Moreover, a full color image can be displayed. Note that other actions and effects of the display device 20 as a whole are the same as those in the fourth exemplary embodiment.

Figure 18:
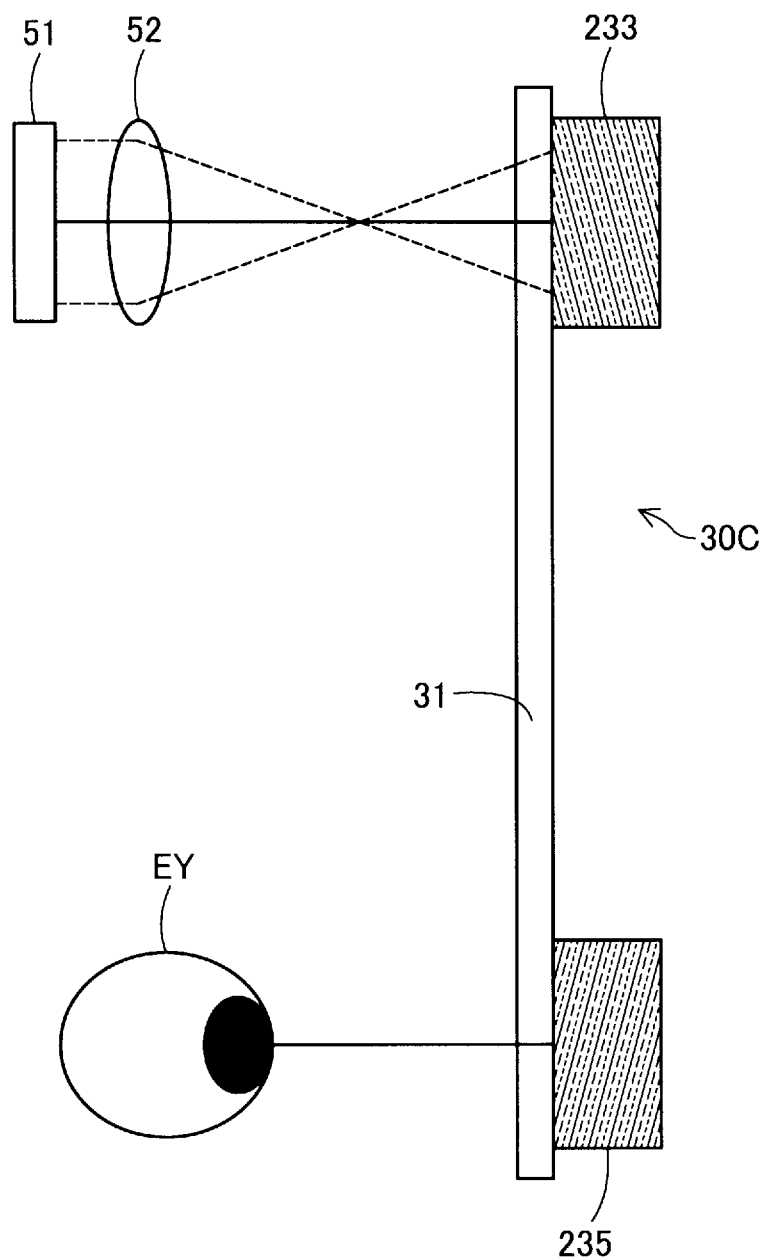
FIG. 18 is an explanatory view illustrating arrangement of an optical system in other exemplary embodiments.

In the fourth exemplary embodiment, the diffraction optical elements that deflect the light of the three primary colors RGB separately are laminated or superposed to be used. As illustrated as a left-eye display unit 30C in FIG. 18, as an incident diffraction optical element 233 and an emission diffraction optical element 235, an integrated hologram in which interference patterns corresponding to the respective colors may be adopted for a diffraction optical element.

F. Other Exemplary Embodiments

Figure 19:
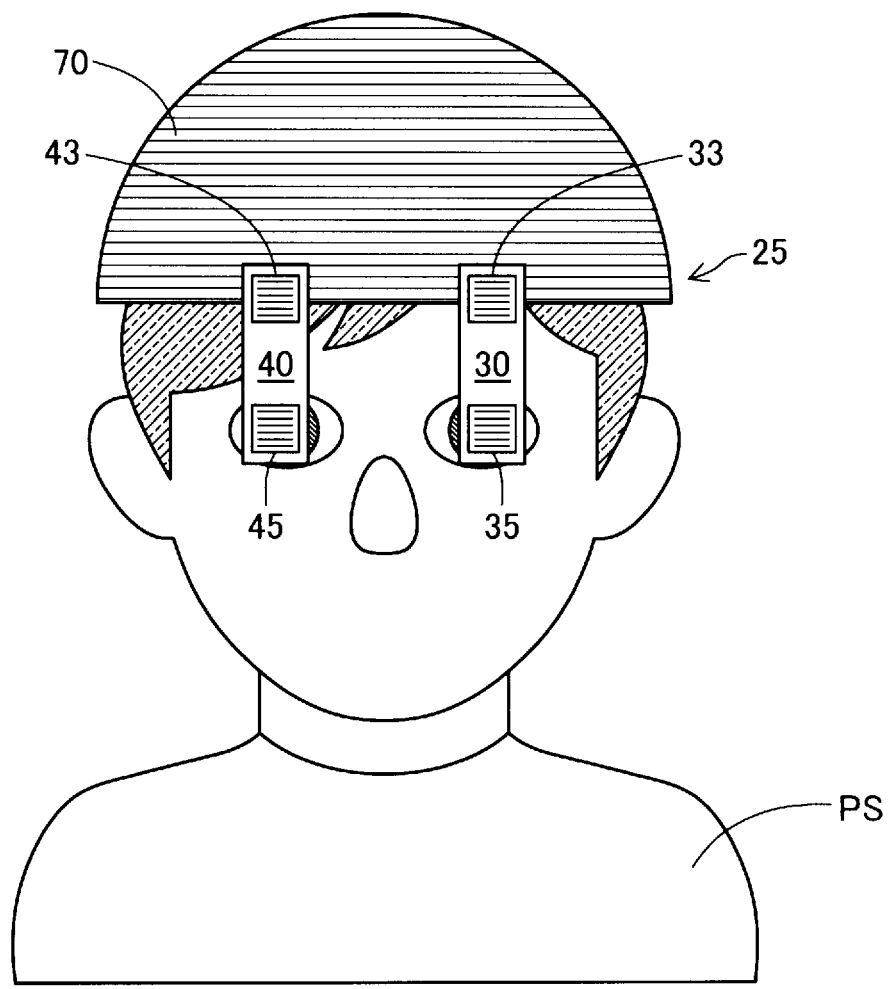
FIG. 19 is a schematic configuration view illustrating an exemplary embodiment of another display device.

In each of the above-mentioned exemplary embodiments, the display device 20 is an eyeglass type, and guides the image light in front of the eye EY from a head of an observer in the horizontal direction. However, the image light may be guided in the vertical direction. As illustrated in FIG. 19, a display device 25 illustrated as another exemplary embodiment includes a head-mounted tool 70 mounted on a head of an observer PS, and has a configuration in which the left-eye display unit 30 and the right-eye display unit 40 are provided in the vertical direction from the head-mounted tool 70. The left-eye display unit 30 and the right-eye display unit 40 include similar configurations as in the first exemplary embodiment to the fourth exemplary embodiment.

In addition to the left-eye display unit 30 and the right-eye display unit 40, the head-mounted tool 70 is provided with the image formation units each including a similar configuration as in the first exemplary embodiment (see FIG. 2). The image formed on the display 51 enters the incident diffraction optical elements 33 and 43 of the left-eye display unit 30 and the right-eye display unit 40, and is guided to the emission diffraction optical elements 35 and 45 through the light-guiding bodies 31 and 41. Even in this manner, unevenness with respect to the light-guiding direction in an image visually recognized by an observer is suppressed. That is, reduction in intensity is suppressed even at sides closer to the edges of the image, and the image is displayed.

In the above-mentioned exemplary embodiment, each of the display devices 20 and 25 is a see-through type enabling an outside scene to be visually recognized, but is not necessarily required to be limited to a see-through type. Further, the present disclosure is not required to be limited to a binocular type, and may be provided as a monocular-type display device. The image formed on the display 51 is not limited to have an aspect ratio of 16:9, and may have other aspect ratios such as a ratio of 4:3. Further, the displayed image is not limited to a rectangular shape in a mathematical sense, and may be formed in various shapes such as a square and an oval. In any shapes, it is only required to obtain a chromaticity range to be expressed and prepare a LUT in accordance with this. Further, the shape of the display 51 itself and the shape of the image to be displayed may be different from each other.

In the above-mentioned exemplary embodiment, the diffraction optical element is prepared for each of the three primary colors RGB. However, the present disclosure is not limited to the three primary colors. For example, a combination of two colors such as RG, GB, and RB may be adopted. For example, a combination such as R/GB, RG/B, and G/RB may be adopted. Further, the present disclosure is not limited to RGB, and a display device may be configured with single different colors such as Y, C, and M or a combination thereof.

The diffraction optical element is not required to be limited to a reflective volumetric hologram, and other diffraction elements may be adopted. For example, a configuration including a transmission-type volumetric hologram in a surface where light from the EL display 51 enters may be adopted, a surface relief hologram having recesses and protrusions on a surface of a base material may be adopted.

G. Other Configuration Examples (1) Further, the present disclosure includes the following configuration examples as the display device. One display device includes an image information unit configured to display an image in a first hue at a display surface, thus emitting the image as image light, an optical system configured to guide the image light to a display position, and a diffraction optical element configured to deflect the image light in the optical system. Here, a first angle at which the diffraction optical element deflects light emitted from a first position of the display surface may be larger than a second angle at which the diffraction optical element deflects light emitted from a second position of the display surface. The image formation unit may emit image light including light emitted from the first position and light emitted from the second position, and a wavelength peak of light emitted from the first position may be present on a long wavelength side with respect to a wavelength peak of light emitted from the second position. In this manner, on the display surface, intensity unevenness of image light, which is caused by reduction in diffraction efficiency due to a difference in deflection angle, can be prevented from being caused.

(2) In such display device, the first position and the second position may be grasped as different positions in a direction corresponding to a surface pitch direction of a diffraction pattern of the diffraction optical element. In the diffraction optical element, the pitch direction of the diffraction pattern matches with the deflection direction in which the light is diffracted. Thus, in this manner, the deflection angle at which the image light from the first position is diffracted by the diffraction optical element is larger than the deflection angle at which the image light from the second position is diffracted by the diffraction optical element.

(3) In such display device, the first position may be a position where the first angle at which light emitted from the first position is deflected is larger than an angle at which light emitted from a center position of the display surface is deflected, and the second position may be a position where the second angle at which light emitted from the second position is deflected is smaller than the angle at which light emitted from the center position of the display surface is deflected. In this manner, on any side as seen from the surface center position, unevenness of intensity of image light can be suppressed.

(4) In such display device, the optical system may include a light-guiding body configured to guide the image light from a position of the image formation unit to the display position, and the diffraction optical element may be provided on at least one of an incident side and an emission side of the light-guiding body. In this manner, intensity unevenness of image light due to a difference in angle of view of at least one diffraction optical element can be suppressed.

(5) In such display device, the primary diffraction optical element may be a reflective volumetric hologram. In this manner, the display device using the diffraction optical elements can be reduced in thickness. The reflective volumetric hologram selectively diffracts light having a specific wavelength, and hence light having other wavelengths passes therethrough. Therefore, high transmittance can be achieved, and an outside scene and an image formed by the image formation unit can be visually recognized easily at the same time.

(6) In such display device, the reflective volumetric hologram may have an interference pattern having even pitch and even inclination in depth and in a surface where image light enters. In this manner, while maintaining angle information that the angle of view of the image light includes, the image light can be guided to the light-guiding body.

(7) In such display device, the image formation unit may include, on the display surface, a plurality of light emitting elements configured to emit the image light, and the plurality of light emitting elements may emit light, the light having different light emission wavelength peaks at different positions on the display surface along a direction in which the diffraction optical element deflects the light. In this manner, a configuration of emitting image light having different center wavelengths on the display surface can be achieved easily.

(8) the plurality of light emitting elements may be LEDs or OLEDs. A peak wavelength of a light emission wavelength can easily differ for each element.

(9) Each of the plurality of light emitting elements may be an OLED including an optical resonator, and the OLED may cause the light emission wavelength peaks to be different by adjusting an optical path length of the resonator. In this manner, a peak of a light emission wavelength can easily differ.

(10) In such display device, the image formation unit may include, on the display surface, a light source configured to emit light in a predetermined wavelength range, and a plurality of shutter elements configured to emit the image light by turning on and off light traveling from the light source, and the light source may emit light having different wavelength peaks in the predetermined wavelength range at different positions of the diffraction optical element along a direction in which the light is deflected. In this manner, the elements are only required to turn on and off light traveling, and a configuration of having different peak wavelengths can be achieved easily.

(11) In such display device, each of the plurality of shutter elements may be any one of an LCD, an LCOS, and a DMD. In this manner, the shutter elements can be achieved easily.

(12) In such display device, the light source may include a plurality of LEDs having the light emission wavelength peaks that are different in the predetermined wavelength range.

(13) Alternatively, a configuration formed of a light emitting body and a filter may be adopted. The light emitting body is configured to emit light in the predetermined wavelength range, and the filter is arranged on at least one of a front side or a rear side of each of the plurality of shutter elements from the light emitting body, and wavelength peaks of light passing through the film are different depending on the position. With such configuration, a configuration of emitting image light having different light emission wavelength peaks from the image formation unit can be achieved easily.

(14) In such display device, the image formation unit may be configured to display, at a display surface, an image containing an image in a second hue being a hue different from the first hue, an image in a third hue being a hue different from the first hue and the second hue, thus emitting the image as image light, the image formation unit may be configured to emit image light of the image in the second hue, the image light including light emitted from the first position and light emitted from the second position, and the light emitted from the first position having a wavelength peak on a long wavelength side with respect to a wavelength peak of the light emitted from the second position, the image formation unit may be configured to emit image light of the image in the third hue, the image light including light emitted from the first position and light emitted from the second position, and a wavelength peak of the light emitted from the first position is on a long wavelength side with respect to a wavelength peak of the light emitted from the second position, and the diffraction optical element may include a first interference pattern, a second interference pattern, and a third interference pattern that are laminated or superposed. In the first interference pattern, the first angle at which light of the image in the first hue emitted from the first position is deflected is larger than the second angle at which light of the image in the first hue emitted from the second position is deflected, In the second interference pattern, a third angle at which light of the image in the second hue emitted from the first position is deflected is larger than a fourth angle at which light of the image in the second hue emitted from the second position is deflected. In the third interference pattern, a fifth angle at which light of the image in the third hue emitted from the first position is deflected is larger than a sixth angle at which light of the image in the third hue emitted from the second position is deflected. In this manner, a full color image can be guided easily to a position of an eye of an observer.

(15) In such display device, the first hue may be red (R), the second hue may be green (G), and the third hue may be blue (B). In this manner, a color image formed by the image light that has different wavelengths can be displayed easily.

(16) The present disclosure includes a mode of a display method of displaying an image. The display method may include displaying an image in a predetermined hue on a display surface, emitting image light corresponding to the image, guiding the image light to a display position by an optical system, deflecting the image light in the optical system, and causing the image light to enter the diffraction optical element so that a deflection angle at which light emitted from a first position of the display surface is diffracted by the diffraction optical element is larger than a deflection angle at which light emitted from a second position of the display surface is diffracted by the diffraction optical element. Light emitted from the first position may have a wavelength peak on a long wavelength side with respect to a wavelength peak of light emitted from the second position. In this manner, on the display surface, intensity unevenness of image light, which is caused by reduction in diffraction efficiency due to a difference in deflection angle, can be prevented from being caused.

(17) The present disclosure includes another mode as a display device. The display device includes an image information unit configured to display an image in a predetermined hue at a display surface, thus emitting the image as image light, an optical system configured to guide the image light to a display position, and a diffraction optical element configured to deflect the image light in the optical system. Here, on the display surface, the image formation unit may emit image light having wavelength distribution in a wavelength range expressing the predetermined hue in a direction corresponding to a direction of the deflection, and emit image light prevented from having the wavelength distribution in the wavelength range expressing the predetermined hue in a direction orthogonal to the direction of the deflection. In this manner, it is only required to emit image light having wavelength distribution in a wavelength range expressing a hue only in a direction in which diffraction efficiency varies by changing the deflection angle of the diffraction optical element, and hence the configuration can be simplified.

(18) In each of the exemplary embodiments described above, part of the configuration achieved by the hardware may be replaced with software. At least part of the configuration achieved by the software may be achieved by a discrete circuit configuration. Further, a part or the entirety of the function of the present disclosure is achieved by software, the software (computer program) may be provided in a form of being stored in a computer readable recording medium. The "computer readable recording medium" is not limited to a portable recording medium such as a flexible disc and a CD-ROM, and include various internal storage devices in a computer such as a RAM and a ROM and external storage devices such as a hard disc that are fixed to a computer. That is, the "computer readable recording medium" broadly includes a freely-selectable recording medium capable of fixing a data packet not in a temporary manner.

The present disclosure is not limited to the exemplary embodiment described above, and can be realized in various configurations without departing from the gist of the present disclosure. For example, appropriate replacements or combinations may be made to the technical features in the exemplary embodiments which correspond to the technical features in the aspects described in the SUMMARY section to solve some or all of the problems described above or to achieve some or all of the advantageous effects described above. Additionally, when the technical features are not described herein as essential technical features, such technical features may be deleted appropriately.

What is claimed is:

1. A display device, comprising:
   an image formation unit configured to display an image in a first hue at a display surface, thus emitting the image as image light;
   a light source, at the display surface, having a first light source unit emitting the image light in the first hue and a second light source unit emitting the image light in the first hue, the first light source unit emitting the image light with a first center wavelength in the first hue, the second light source unit emitting the image light with a second center wavelength in the first hue, the second center wavelength being different from the first center wavelength and having a peak on a short wavelength side with respect to the first center wavelength;
   an optical system configured to guide the image light to a display position; and
   a diffraction optical element configured to deflect the image light in the optical system, wherein
   a first angle at which the diffraction optical element deflects light emitted from a first position of the display surface is larger than a second angle at which the diffraction optical element deflects light emitted from a second position of the display surface,
   the light emitted from the first position is provided by the first light source unit,
   the light emitted from the second position is provided by the second light source unit,
   the image formation unit emits image light including light emitted from the first position and light emitted from the second position, and
   a wavelength peak of light of the first hue provided by the first light source unit and emitted from the first position is present on a long wavelength side with respect to a wavelength peak of light of the first hue provided by the second light source unit and emitted from the second position.

2. The display device according to claim 1, wherein the first position and the second position are different positions in a direction corresponding to a surface pitch direction of a diffraction pattern of the diffraction optical element.

3. The display device according to claim 1, wherein the first position is a position where the first angle at which light emitted from the first position is deflected is larger than an angle at which light emitted from a center position of the display surface is deflected, and the second position is a position where the second angle at which light emitted from the second position is deflected is smaller than the angle at which light emitted from the center position of the display surface is deflected.

4. The display device according to claim 1, wherein the optical system is a light-guiding body configured to guide the image light from a position of the image formation unit to the display position, and the diffraction optical element is provided on at least one of an incident side and an emission side of the light-guiding body.

5. The display device according to claim 1, wherein the diffraction optical element is a reflective volumetric hologram.

6. The display device according to claim 5, wherein the reflective volumetric hologram has an interference pattern having even pitch and even inclination in depth and in a surface where image light enters.

7. The display device according to claim 1, wherein the image formation unit includes, at the display surface, a plurality of light emitting elements configured to emit the image light in the first hue, and light emitted by the plurality of light emitting elements has different light emission wavelength peaks in the first hue at different positions on the display surface along a direction in which the diffraction optical element deflects the light.

8. The display device according to claim 7, wherein the plurality of light emitting elements are LEDs or OLEDs.

9. The display device according to claim 7, wherein the light emitting elements are OLEDs including optical resonators, and the OLEDs cause the light emission wavelength peaks to be different by adjusting optical path lengths of the optical resonators.

10. The display device according to claim 1, wherein the image formation unit includes, at the display surface, a plurality of shutter elements configured to emit the image light by turning on and off light traveling from the light source, the light source is configured to emit light in a predetermined wavelength range of the first hue, and the light source emits light having different wavelength peaks in the predetermined wavelength range of the first hue at different positions along a direction in which the diffraction optical element deflects the light.

11. The display device according to claim 10, wherein the shutter element is any one of an LCD, an LCOS, and a DMD.

12. The display device according to claim 10, wherein the light source includes a plurality of LEDs having the light emission wavelength peaks that are different in the predetermined wavelength range of the first hue.

13. The display device according to claim 10, wherein the light source includes:
    a light emitting body configured to emit light in the predetermined wavelength range; and
    a filter being positioned on at least one of a front side or a rear side of the shutter element, wavelength peaks of light passing through the film being different depending on the position.

14. The display device according to claim 1, wherein the image formation unit is configured to emit image light of the image in a second hue different from the first hue, the image light including light emitted from the first position and light emitted from the second position, and a wavelength peak of the light emitted from the first position is on a long wavelength side with respect to a wavelength peak of the light emitted from the second position, the image formation unit is configured to emit image light of the image in a third hue different from the first hue and the second hue, the image light including light emitted from the first position and light emitted from the second position, and a wavelength peak of the light emitted from the first position is on a long wavelength side with respect to a wavelength peak of the light emitted from the second position, the diffraction optical element includes a first interference pattern, a second interference pattern, and a third interference pattern that are laminated or superposed, with the first interference pattern, the first angle at which light of the image in the first hue emitted from the first position is deflected is larger than the second angle at which light of the image in the first hue emitted from the second position is deflected, with the second interference pattern, a third angle at which light of the image in the second hue emitted from the first position is deflected is larger than a fourth angle at which light of the image in the second hue emitted from the second position is deflected, and with the third interference pattern, a fifth angle at which light of the image in the third hue emitted from the first position is deflected is larger than a sixth angle at which light of the image in the third hue emitted from the second position is deflected.

15. The display device according to claim 14, wherein
the first hue is red (R),
the second hue is green (G), and
the third hue is blue (B).

16. A display method of displaying an image, the display method comprising:

displaying an image in a first hue at a display surface, thus emitting image light corresponding to the image;

guiding the image light to a display position by an optical system;

deflecting the image light by a diffraction optical element in the optical system; and causing the image light to enter the diffraction optical element so that a deflection angle at which light emitted from a first position of the display surface is diffracted by the diffraction optical element is larger than a deflection angle at which light emitted from a second position of the display surface is diffracted by the diffraction optical element, wherein the image light includes the light emitted from the first position and the light emitted from the second position, the light emitted from the first position is provided by a first light source unit that emits the image light in the first hue of a light source, the first light source unit emitting the image light with a first center wavelength in the first hue, the light emitted from the second position is provided by a second light source unit that emits the image light in the first hue of the light source, the second light source unit emitting the image light with a second center wavelength in the first hue, the second center wavelength being different from the first center wavelength and having a peak on a short wavelength side with respect to the first center wavelength, the light provided by the first light source unit and emitted from the first position has a wavelength peak of the first hue on a long wavelength side with respect to a wavelength peak of the light of the first hue provided by the second light source unit and emitted from the second position.

* * * * *